United States Patent
Nakanishi et al.

(10) Patent No.: US 9,224,933 B2
(45) Date of Patent: Dec. 29, 2015

(54) LIGHT EMITTING DEVICE PACKAGE AND PACKAGE FOR MOUNTING LIGHT EMITTING DEVICE

(71) Applicant: SHINKO ELECTRIC INDUSTRIES CO., LTD., Nagano (JP)

(72) Inventors: Tsukasa Nakanishi, Nagano (JP); Atsushi Nakamura, Nagano (JP); Takayuki Matsumoto, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 14/333,602

(22) Filed: Jul. 17, 2014

(65) Prior Publication Data

US 2015/0028372 A1    Jan. 29, 2015

(30) Foreign Application Priority Data

Jul. 26, 2013   (JP) .................................. 2013-156153

(51) Int. Cl.
| | |
|---|---|
| H01L 29/22 | (2006.01) |
| H01L 33/62 | (2010.01) |
| H01L 33/48 | (2010.01) |
| H01L 33/60 | (2010.01) |
| H01L 25/16 | (2006.01) |

(52) U.S. Cl.
CPC .............. *H01L 33/62* (2013.01); *H01L 33/486* (2013.01); *H01L 25/167* (2013.01); *H01L 33/60* (2013.01); *H01L 2224/16225* (2013.01); *H01L 2924/15311* (2013.01)

(58) Field of Classification Search
CPC ................................ H01L 33/60; H01L 33/62
USPC .................................. 257/81, 95, 98, 99, 100
See application file for complete search history.

(56) References Cited

U.S. PATENT DOCUMENTS 6,614,103 B1 *  9/2003  Durocher et al. ............. 257/678
7,518,155 B2    4/2009  Ishidu et al.

FOREIGN PATENT DOCUMENTS

| EP | WO2012/022782 | * | 2/2012 |
| WO | 2004/084319 | | 9/2004 |

* cited by examiner

*Primary Examiner* — Hung Vu
(74) *Attorney, Agent, or Firm* — IPUSA, PLLC

(57) ABSTRACT

A package for mounting a light emitting device thereon. The package includes a substrate, a light emitting device mounting part including a wiring formed on one surface of the substrate, the wiring including two areas that are arranged facing each other and being separated a predetermined interval apart from each other in a plan view, first and second through-wirings that penetrate the substrate and are provided on the two areas, respectively, each of the first and second through-wirings including one end electrically connected to the light emitting device mounting part and another end exposed from another surface of the substrate. A part of each of the first and second through-wirings includes a maximum part having a plan-view shape that is larger than a plan-view shape of the one end of each of the first and second through-wirings.

13 Claims, 16 Drawing Sheets

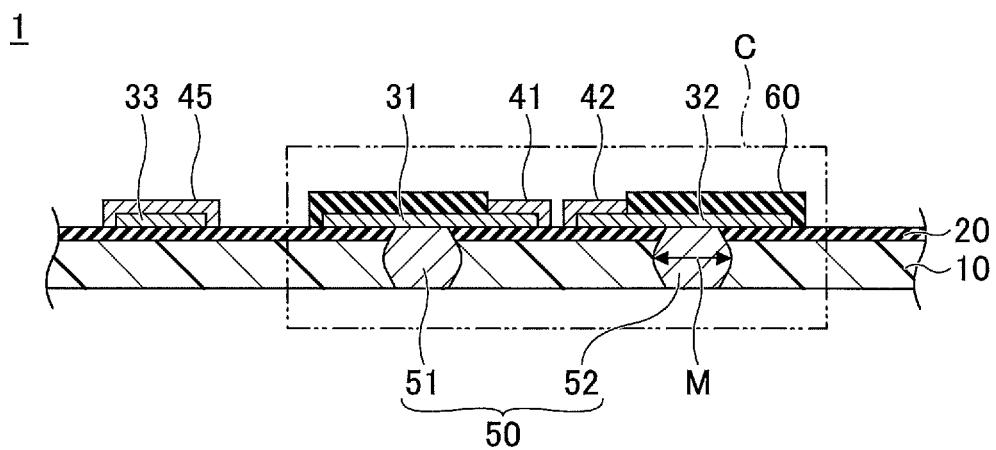
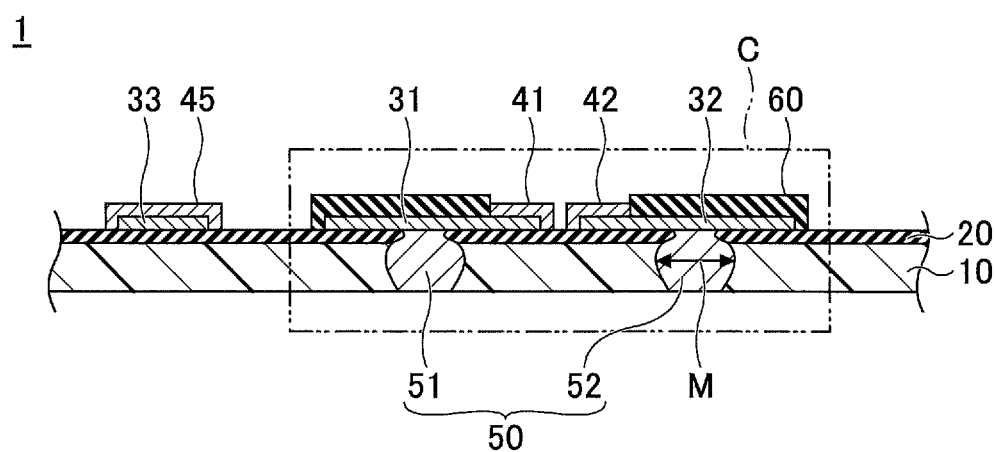

LIGHT EMITTING DEVICE PACKAGE AND PACKAGE FOR MOUNTING LIGHT EMITTING DEVICE

CROSS-REFERENCE TO RELATED APPLICATIONS

This application is based upon and claims the benefit of priority of the prior Japanese Patent Application No. 2013-156153 filed on Jul. 26, 2013, the entire contents of which are incorporated herein by reference.

FIELD

The embodiments discussed herein are related to a package for mounting a light emitting device (light emitting device mounting package), and a package having the light emitting device mounted thereon (light emitting device package).

BACKGROUND

In recent years, there is proposed a package for mounting a light emitting device such as an LED (Light Emitting Diode) thereon (LED mounting package). For example, the LED mounting package may include a substrate having one surface formed with an LED connection pad (i.e. pad to be connected to a LED) and another surface formed with an external connection pad (i.e. pad to be connected to an external connection device) on another surface, and a through-wiring that connects the LED connection pad and the external connection pad (see, for example, International Publication Pamphlet No. WO 2004/084319).

However, the LED mounting package is required to form both the LED connection pad and the external connection pad on the one and the other surfaces of the substrate (e.g., ceramic substrate) after forming the through-wiring in a through-hole. Thus, a large number of processes is required for manufacturing the LED mounting package. This results in an increase of manufacturing cost of the LED mounting package.

As one method for reducing the manufacturing cost of the LED mounting package, the LED mounting package may be manufactured without forming an external connection pad on the other surface of the substrate and instead use a part of the through-wiring exposed from the other surface of the substrate as the external connection pad.

However, this method may lack a sufficient bonding strength because the through-wiring and the sidewall of the through-hole are not bonded to each other. As a result, a so-called "unsheathing" phenomenon may occur in which the LED connection pad and the through-wiring fall off from the substrate in a case where a pulling force is applied in a direction separating the LED connection from the substrate.

SUMMARY

According to an aspect of the invention, there is provided a package for mounting a light emitting device thereon that includes a substrate, a light emitting device mounting part including a wiring formed on one surface of the substrate, the wiring including two areas that are arranged facing each other and being separated a predetermined interval apart from each other in a plan view, first and second through-wirings that penetrate the substrate and are provided on the two areas, respectively, each of the first and second through-wirings including one end electrically connected to the light emitting device mounting part and another end exposed from another surface of the substrate. A part of each of the first and second through-wirings includes a maximum part having a plan-view shape that is larger than a plan-view shape of the one end of each of the first and second through-wirings.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A-3B are schematic diagrams for describing a maximum part according to an embodiment of the present invention;

DESCRIPTION OF EMBODIMENTS

Figure 1:
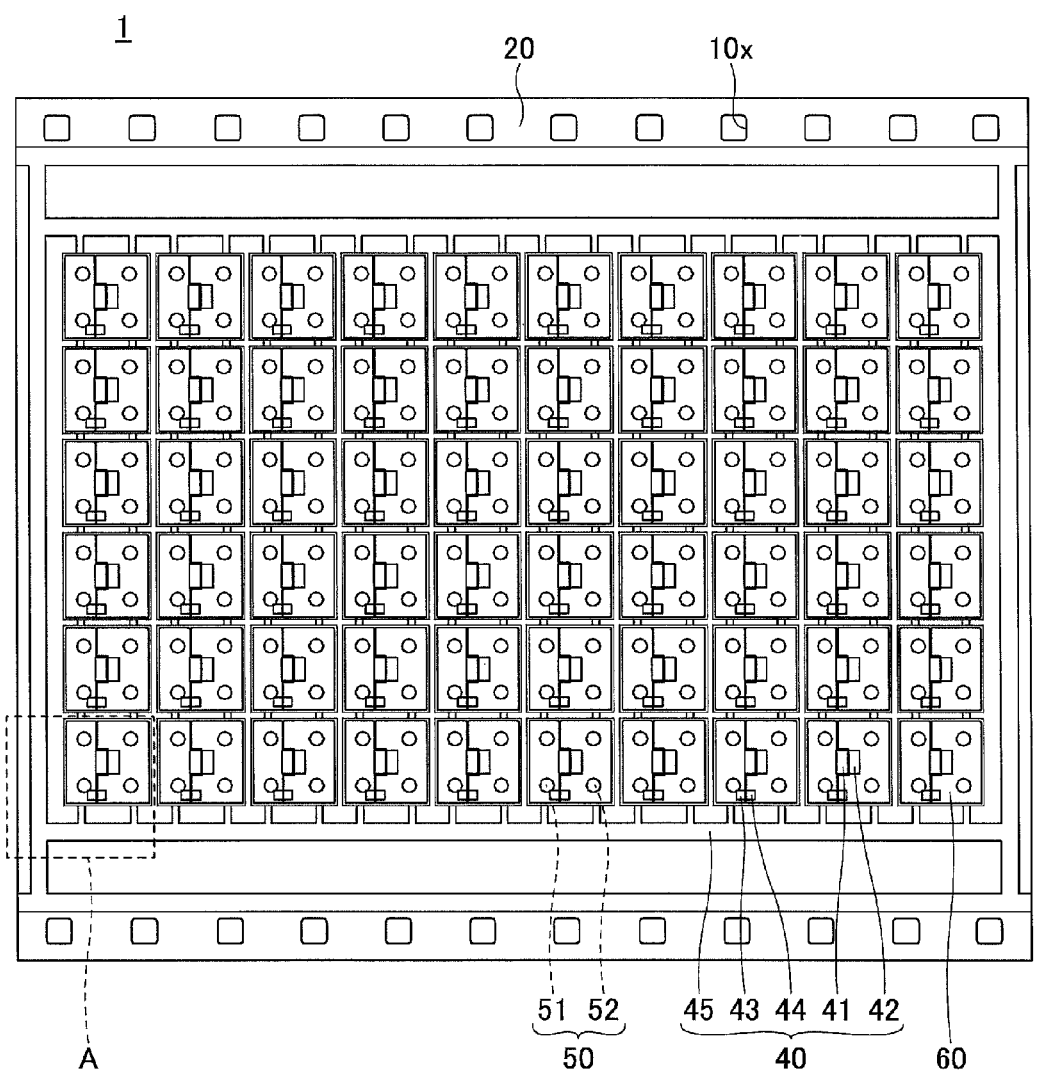
FIG. 1 is a plan view of a light emitting device mounting package according to a first embodiment of the present invention.

Next, embodiments of the present invention are described with reference to the accompanying drawings. Throughout the drawings, like components/parts are denoted with like reference numerals. Thus, detailed descriptions of like components/parts denoted with like reference numerals are omitted.

First Embodiment

Structure of Light Emitting Device Mounting Package of First Embodiment

Figure 2A:
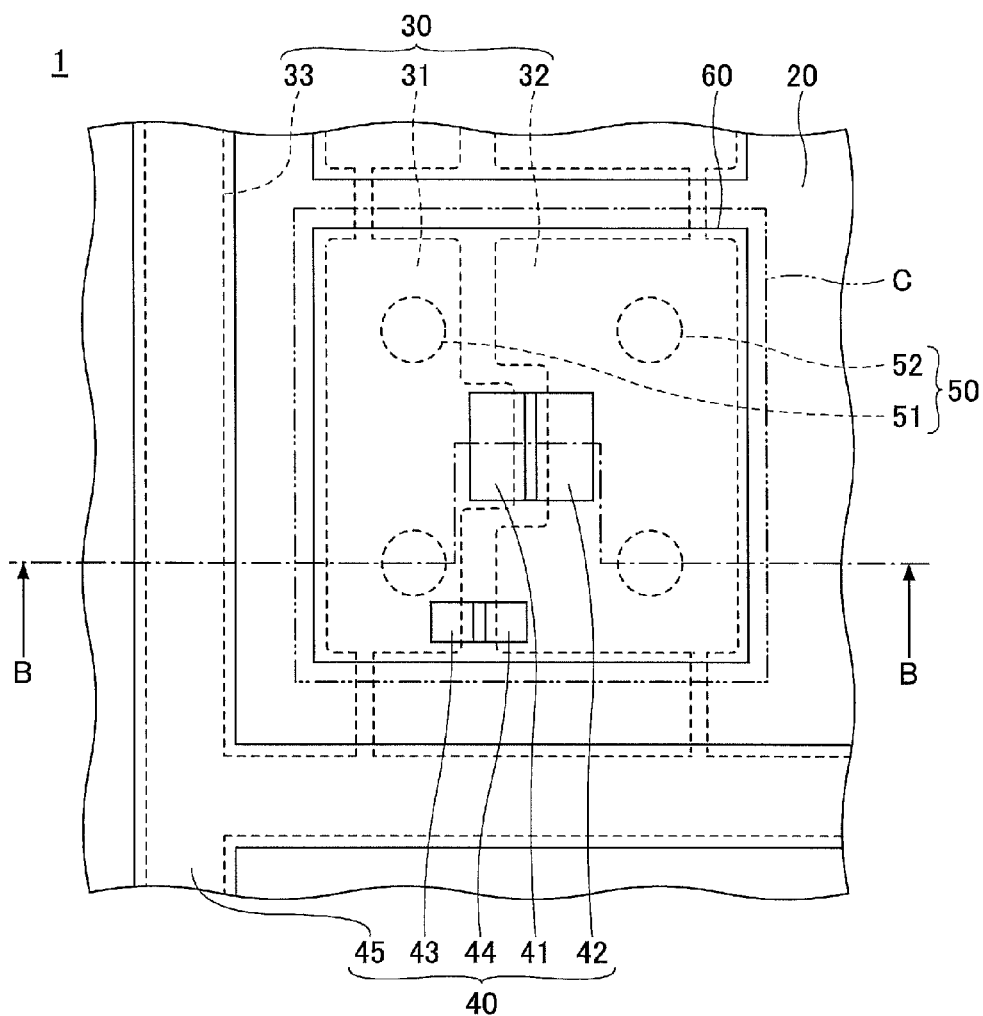
FIGS. 2A-2B are enlarged views illustrating a part A of FIG. 1.
Figure 2B:
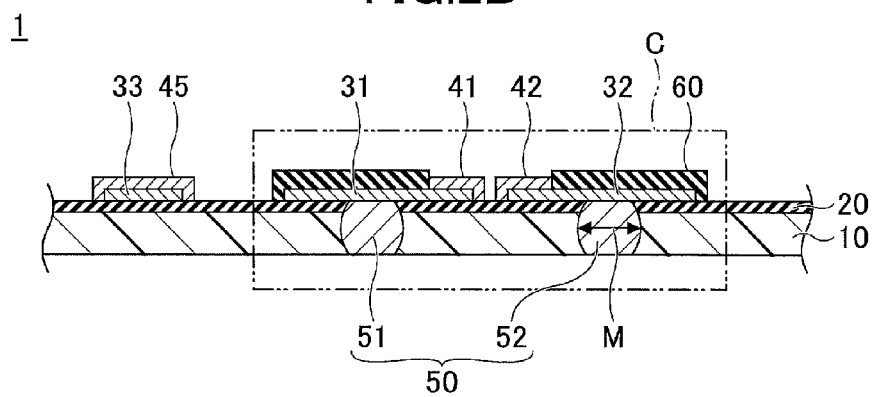

First, a structure of a package for mounting a light emitting device (hereinafter referred to as a "light emitting device mounting package") 1 according to a first embodiment of the present invention is described. FIG. 1 is a plan view of the light emitting device mounting package 1 of the first embodiment. FIGS. 2A and B are enlarged views illustrating part A of FIG. 1 (i.e. the part surrounded by a dashed line in FIG. 1). FIG. 2A is a plan view of the part A. FIG. 2B is a cross-sectional view taken along line B-B of FIG. 2A.

With reference to FIGS. 1, 2A, and 2B, the light emitting device mounting package 1 includes, for example, a substrate 10, an adhesive layer 20, a wiring 30 (wirings 31, 32 and a bus line 33), a plating film 40 (plating films 41-45), a through-wiring 50 (through-wirings 51, 52), and an insulating layer 60. It is to be noted that a "plan view" of an object refers to viewing the object from a direction normal to an upper or lower surface of the substrate 10. A "plan-view shape" of an object refers to a shape of the object viewed from a direction normal to an upper or lower surface of the substrate 10.

An area C illustrated with a dash-double dot line in FIGS. 2A and 2B corresponds to an area of a single individualized unit of the light emitting device mounting package 1 that is obtained by dicing the light emitting device mounting package 1 along the dash-double dot line (hereinafter referred to as "individual package area C"). That is, the light emitting device mounting package 1 includes multiple individual package areas C in which each individual package area C is configured to have a single light emitting device mounted thereon. It is to be noted that, although the light emitting device mounting package 1 of FIG. 1 includes sixty individual package areas C, the number of individual package areas C included in the light emitting diode mounting package 1 is not limited to sixty individual package areas C.

For example, an insulating resin film having a flexible property may be used as the substrate 10 of the light emitting device mounting package 1. The insulating resin film may be, for example, a film formed of a polyimide type resin (polyimide tape), a film formed of an epoxy type resin, or a film formed of a polyester type resin. However, the substrate 10 is not limited to an insulating resin film having a flexible property. For example, a grade FR4 (Flame Retardant 4) glass epoxy resin may be used as the substrate 10. The thickness of the substrate 10 may be, for example, approximately 12 μm to 75 μm.

The adhesive layer 20 is adhered to one surface of the substrate 10. The wiring 31, the wiring 32, and the bus line 33 are adhered to the substrate 10 interposed by the adhesive layer 20. For example, a heat resistant adhesive agent formed of an insulating resin such as an epoxy type adhesive agent or a polyimide type adhesive agent may be used to form the adhesive layer 20. The thickness of the adhesive layer 20 may be, for example, approximately 8 μm to 18 μm.

Multiple sprocket holes 10x are formed on both ends of the substrate 10 (see, for example, FIG. 1). The sprocket holes 10x are successively arranged in a predetermined direction at substantially equal intervals. In a case where the light emitting device mounting package 1 is attached to a mounting apparatus for mounting light emitting devices thereon, the sprocket holes 10x are used as through-holes that mesh with corresponding pins of a sprocket driven by a motor or the like, so that the light emitting device mounting packages 1 can be pitch-fed.

The width of the substrate 10 (direction orthogonal to the direction in which the sprocket holes 10x are arranged) is determined according to the mounting apparatus to which the light emitting device mounting package 1 is attached. The width of the substrate 10 may be, for example, approximately 40 mm to 90 mm. On the other hand, the length of the substrate 10 (direction in which the sprocket holes 10x are arranged) may be arbitrarily determined.

The light emitting device mounting package 1 of FIG. 1 includes 10 rows of the individual package areas C. However, in a case where an insulating resin film having a flexible property is used as the substrate 10, the light emitting device mounting package 1 may include more rows of the individual package areas C (e.g., approximately 100 rows) by increasing the length of the substrate 10 and forming the light emitting device mounting package 10 into a tape-like shape. In this case, the light emitting device mounting package 1 may be shipped in a state of wound around a reel.

The bus line 45 having its surface covered by the plating film 40 (45) is arranged between the sprocket holes 10x arranged on both ends of the substrate 10. The bus line 45 surrounds the entire of the individual package areas C that are vertically and horizontally arranged in the light emitting device mounting package 1. The bus line 33 is used for feeding power when forming the plating film 40 (41, 42) on the wirings 31, 32 with an electroplating method. The wirings 31, 32, which constitute a light emitting device mounting part inside the light emitting device mounting package 1, are electrically connected to the bus line 33. A method for forming the plating film 40 on the wiring 30 by using the bus line 33 is described in detail below.

In each of the individual package areas C, the wirings 31, 32 are provided on one surface of the substrate 10 interposed by the adhesive layer 20. The wiring 31 is electrically connected to one end of the through-wiring 51 that penetrates the substrate 10 and the adhesive layer 20. The wiring 32 is electrically connected to one end of the through-wiring 52 that penetrates the substrate 10 and the adhesive layer 20.

The other end of the through-wiring 51 and the other end of the through-wiring 52 may be, for example, substantially flush with another surface of the substrate 10, respectively. It is to be noted that, two through-wirings 51 are connected to the wiring 31, and two through-wirings 52 are connected to the wiring 32.

From the standpoint of heat radiating property, multiple of both the through-wiring 51 and the through-wiring 52 are preferred to be provided in the substrate 10. Nevertheless, one of each of the through-wiring 51 and the through-wiring 52 may be provided. At least one of each of the wiring 31 and the wiring 32 is to be provided on the substrate 10. Nevertheless, from the standpoint of achieving balance of a package after the light emitting device mounting package 1 is cut and respective individual package areas C are arranged on a predetermined flat surface, it is preferable to provide two or more through-wirings 51, 52 in correspondence with each of the wirings 31, 32. For example, in a case where a plan-view shape of the individual package area C is a rectangular shape, it is preferable to provide one of the through-wirings (connection terminals) 51, 52 on each corner of the individual package area C. For example, in a case of mounting a package (e.g., light emitting device mounting package or a light emitting device package) on a metal substrate, the package can be prevented from being mounted in a tilted position by providing the through-wirings 51, 52 on the corners of the individual package area C.

For the sake of convenience, different reference numerals are used to differentiate between the through-wiring 51 and the through-wiring 52. It is, however, to be noted that the through-wiring 51 and the through-wiring 52 are both formed in the same step, and a same material is used to form both the through-wiring 51 and the through-wiring 52. In a case where there is no need to differentiate the through-wiring 51 and the through-wiring 52, the through-wiring 51 and the through-wiring 52 may be collectively referred to as "through-wiring 50". Further, exposed parts of the through-wirings 51, 52 may also be referred to as "connection terminals". For example, copper (Cu) may be used as the material of the through-wiring 50.

A plan-view shape of one end of the through-wiring 50 (i.e. an end of the through-wiring 50 that contacts the wiring 30) may be, for example, a circular shape. In this case, the diameter of the plan-view shape of the one end of the through-wiring 50 may be, for example, approximately 0.5 mm to 1 mm. However, because the through-wiring 50 not only contributes to electric connection but also heat radiation, the diameter of the plan-view shape of the one end of the through-wiring 50 may be greater than 1 mm in a case of, for example, improving heat radiation. Alternatively, the plan-view shape of the one end of the through-wiring 50 may be, for example, a rectangular shape or an elliptical shape. By forming the plan-view shape of the one end of the through-wiring 50 with a rectangular shape, a large area for contacting the wiring 30 can be obtained. Thus, heat radiation can be further improved (see below-described fourth and fifth embodiments).

Further, a part of the through-wiring 50 that is buried in the substrate 10 includes a maximum part M which has a plan-view shape larger than the plan-view shape of the one end of the through-wiring 50. For example, the maximum part M may be formed by forming both side surfaces of the through-wiring 50 with a circular arc shape from a cross-sectional view. That is, a part of the through-wiring 50 in a thickness direction of the substrate 10 (e.g., center part of the through-wiring 50 in the thickness direction of the substrate 10) may be expanded in a horizontal direction, so that the side surfaces of the through-wirings 50 form a circular arc-shaped cross section.

However, the cross section of the expanded part of the through-wiring 50 is not limited to the shape in which both side surfaces of the through-wiring 50 have circular arc shapes. For example, as illustrated in FIG. 3A, the maximum part M may be formed by forming both side surfaces of the through-wiring 50 with a substantially V-like shape from a cross-sectional view (i.e. the maximum part M having a substantially hexagonal cross section). That is, a part of the through-wiring 50 in a thickness direction of the substrate 10 may be expanded in a horizontal direction, so that the side surfaces of the through-wiring 50 form a substantially V-like shape. Alternatively, as illustrated in FIG. 3B, the maximum part M may be formed by forming both side surfaces of the through-wiring 50 with a more complicated shape from a cross-sectional view.

Because the part of the through-wiring 50 includes the maximum part M having a plan-view shape larger than the plan view shape of the one end of the through-wiring 50, the "unsheathing" of the wiring 30 and the through-wiring 50 can be prevented.

The wiring 31 and the wiring 32 are covered by the insulating layer 60 provided almost entirely (except for some parts) on the individual package area C. A part of the wiring 31 and a part of the wiring 32 are exposed from the insulating layer 60. The plating films 41, 42, 43, and 44 are formed on the areas of the insulating layer 60 from which the parts of the wirings 31, 32 are exposed.

The insulating layer 60 is preferred to be provided to expose the surface of the adhesive layer 20 at a border part between adjacent individual package areas C. By providing the insulating layer 60 to expose the border part between adjacent individual package areas C, a rim part of the insulating layer 60 can be prevented from chipping or falling off in a case of cutting the light emitting device mounting package 1 into respective individual package areas C. Thereby, a surface area of the insulating layer 60 can be prevented from being reduced, and reflectivity of the insulating layer 60 can be prevented from decreasing. Further, in this case, the rim part of the insulating layer 60 is positioned (retracted) more inward relative to a rim part of the substrate 10 when the light emitting device mounting package 1 is cut into respective individual package areas C.

In a case where chipping or the like does not occur in the insulating layer 60, the insulating layer 60 may be provided on the entire surface of the adhesive layer 20 including the surface of the adhesive layer 20 at the border part between adjacent individual package areas C. In this case, the side surface of the insulating layer 60, the side surface of the substrate 10, and the side surface of the adhesive layer 20 become substantially flush with each other.

For the sake of convenience, different reference numerals are used to indicate each of the wiring 31, the wiring 32, and the bus line 33. It is, however, to be noted that the wiring 31, the wiring 32, and the bus line 33 are formed in the same step, and a same material is used to form the wiring 31, the wiring 32, and the bus line 33. Further, the wiring 31, the wiring 32, and the bus line 33 may be collectively referred to as the "wiring 30" in a case where there is no need to differentiate between the wiring 31, the wiring 32, and the bus line 33. For example, copper (Cu) may be used as the material of the wiring 30. The thickness of the wiring 30 may be, for example, approximately 12 μm to 35 μm.

Similarly, for the sake of convenience, different reference numerals are used to indicate each of the plating films 41 to 45. It is, however, to be noted that the plating films 41 to 45 are formed in the same step, and a same material is used to form the plating films 41 to 45. Further, the plating films 41 to 45 may be collectively referred to as the "plating film 40" in a case where there is no need to differentiate between the plating films 41-45.

The plating film 40 may be, for example, a Ni/Au film including nickel (or a nickel alloy) and gold (or a gold alloy), a Ni/Pd/Au film including nickel (or a nickel alloy), palladium (or a palladium alloy), and gold (or a gold alloy), or a Ni/Pd/Ag/Au film including nickel (or a nickel alloy), palladium (or a palladium alloy), silver (or a silver alloy), and gold (or a gold alloy). Alternatively, the plating film may be, for example, a Ag film including silver (or a silver alloy), a Ni/Ag film including nickel (or a nickel alloy) and silver (or a silver alloy), Ni/Pd/Ag film including nickel (or a nickel alloy), palladium (or a palladium alloy), and silver (or a silver alloy). It is to be noted that a "AA/BB film" indicates an AA film and a BB film layered on a target object in this order. The same applies to a layered structure formed of three or more layers of film.

Among the materials that form the plating film 40, the thickness of the Au film (or Au alloy film) and the Ag film (or Ag alloy film) is preferably 0.1 μm or more, respectively. Among the materials that form the plating film 40, the thickness of the Pd film (or Pd alloy film) is preferably 0.005 μm.

Among the materials that form the plating film 40, the thickness of the Ni film (or Ni alloy film) is preferably 0.5 μm or more. It is to be noted that, in general, a plating film similar to the plating film 40 is to be provided on the other end of the through-wiring 50.

The insulating layer 60 is provided for increasing reflectivity of the light radiated from a light emitting device to be mounted on the package segment area C and also for increasing heat radiation of the heat radiated from the light emitting device. For example, the material of the insulating layer 60 may be, for example, a silicone type resin (e.g., epoxy type resin, organopolysiloxane) that includes a filler or pigment of titanium oxide ($TiO_2$) or barium sulfate ($BaSO_4$). Alternatively, the material of the insulating layer 60 may be a white ink that includes the above-described materials used for the insulating layer 60.

From a plan view, the wiring 31 and the wiring 32 constitute two areas that are arranged facing each other and separated a predetermined interval apart from each other. These two areas constitute a light emitting device mounting part. In other words, the light emitting device mounting part in each package segment area C includes a metal layer provided as a plane (flat plane) on substantially the entire surface of the substrate 10. By forming a predetermined slit (gap) in the metal layer, the two areas (wiring 31 and wiring 32) facing each other are separated. It is to be noted that the predetermined gap (slit) has a width corresponding to a gap between one electrode and another electrode of a light emitting device.

A rim of the light emitting device part is provided (retreated) more inward relative to a rim of the substrate 10. Therefore, when the light emitting device mounting package is cut into individual package segment areas C, the side surface of the light emitting device part (wiring 31, wiring 32) is not exposed, so that short-circuiting or the like is prevented from occurring when the light emitting device mounting package 1 is used.

A light emitting device is mounted on the light emitting device mounting part. Thereby, one of the plating films 41, 42 formed in a part of the light emitting device mounting part is connected to one electrode of the light emitting device whereas another one of the plating films 41, 42 is connected to another electrode of the light emitting device. That is, a part of the wiring 31 having the plating film 41 formed thereon and a part of the wiring 32 having the plating film 42 formed thereon are arranged facing each other and separated a predetermined interval apart from each other. The plating film 41 is a connection part that is to be connected to one of the electrodes of a light emitting device, and the plating film 42 is a connection part that is to be connected to another one of the electrodes of the light emitting device. The wiring 31 serving as the light emitting device mounting part is connected to the through-wiring 51 provided directly below the wiring 31. The wiring 32 serving as the light emitting device mounting part is connected to the through-wiring 52 provided directly below the wiring 32. Thereby, the heat released by the light emitting device can be efficiently radiated by way of the through-wirings 51, 52.

Further, the part of the wiring 31 having the plating film 41 formed thereon and the part of the wiring 32 having the plating film 42 formed thereon are arranged facing each other and separated by a predetermined interval from each other. Thereby, a protection component can be mounted on the plating films 41, 42. One of the plating films 41, 42 is connected to one of the electrodes of the protection component whereas the other one of the plating films 41, 42 is connected to another one of the electrodes of the protection component. That is, the plating film 41 is a connection part to be connected to the one of the electrodes of the protection component, and the plating film 42 is a connection part to be connected to the other one of the electrodes of the protection component. However, the mounting of the protection component is not required. That is, the protection component may be mounted according to necessity.

The protection component may have a Zener diode mounted thereon. In a case of mounting the Zener diode, the one having a high electric potential (positive side of light emitting device) among the plating film 41 and the plating film 42 is assumed as an anode side, and the other one having a low electric potential (negative side of light emitting device) among the plating film 41 and the plating film 42 is assumed as a cathode side. By mounting a Zener diode between the plating film 41 and the plating film 42, a voltage between the plating film 41 and the plating film 42 can be prevented from becoming equal to or greater than a predetermined voltage (Zener voltage). Thereby, the light emitting device to be mounted can be protected.

At an area where the wiring 31 and the wiring 32 face each other and are separated by a predetermined interval from each other from a plan view, a part of the wiring 31 is formed as a convex part whereas a part of the wiring 32 is formed as a concave part. Thus, the convex part of the wiring 31 can be accommodated in the concave part of the wiring 32. Accordingly, the convex part of the wiring 31 and the concave part of the wiring 32 are used as connection parts that are connected, respectively to the one or the other electrode of the light emitting diode. Further, the area where the wiring 31 and the wiring 32 linearly face each other and are separated a predetermined interval from each other from a plan view (i.e. parts of the wirings 31, 32 besides the convex part of the wiring 31 and the concave part of the wiring 32) is used as a connection part that is connected to the electrodes of the protection component. In the example illustrated in FIG. 2A, the convex part of the wiring 31 and the concave part of the wiring 32 are provided substantially at a center of the area where the wiring 31 and the wiring 32 face each other and are separated by a predetermined interval from each other from a plan view. Further, the connection part to be connected to the electrodes of the protection component is positioned below the wirings 31, 32. Nevertheless, the arrangement of the convex part, the concave part, and the connection part of the wirings 31, 32 is not limited to the arrangement illustrated in FIG. 2A.

The reason that the wirings 31, 32 are formed in the above-described pattern is because the part for mounting the protection component is to be separated as far as possible from the part for mounting the light emitting device. In a case where the protection component is mounted in the vicinity of the light emitting device, the protection component may block a part of the light radiated from the light emitting device and decrease the illumination of the light emitting device. By arranging the wirings 31, 32 in the pattern illustrated in FIGS. 2A and 2B, the protection component can be mounted as far as possible from the light emitting device, and the protection component can be prevented from being mounted directly beside the light emitting device. Accordingly, the illumination of the light emitting device can be prevented from decreasing. Nevertheless, the pattern of the wiring 31 and the wiring 32 is not limited to the above-described pattern.

Figure 4:
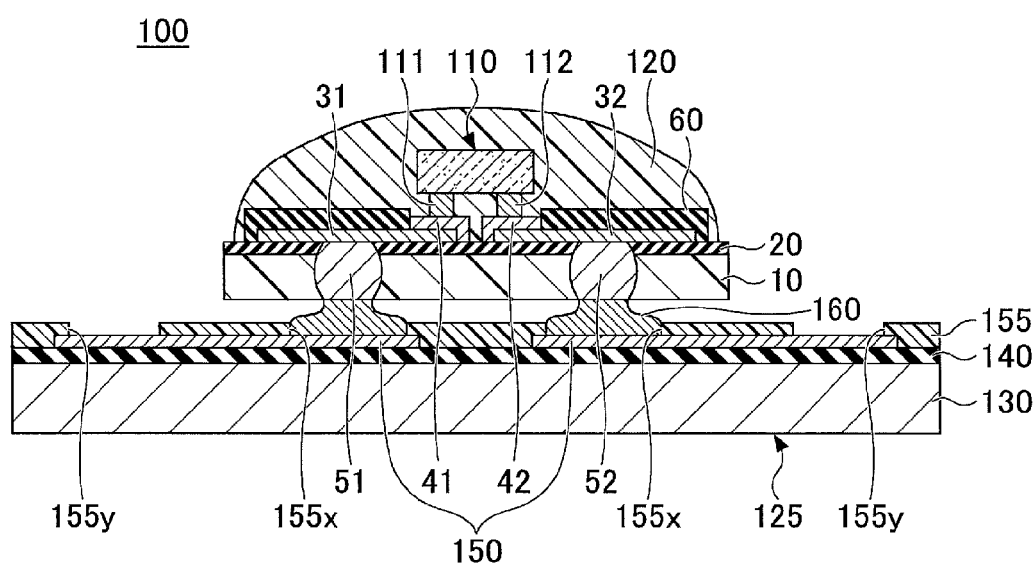
FIG. 4 is a cross-sectional view illustrating a light emitting device package according to a first embodiment of the present invention.

FIG. 4 is a cross-sectional view illustrating a light emitting device package 100 according to the first embodiment of the present invention. With reference to FIG. 4, the light emitting device package 100 is obtained by cutting the light emitting diode mounting package 1 into respective individual package areas C, mounting a light emitting device 110 on the light emitting device mounting part (wiring 31 and wiring 32) in the individual package area C, encapsulating the light emitting device 110 with an encapsulating resin 120, and further mounting the light emitting device 110 (being mounted on the light emitting device mounting package) on a metal substrate 125.

The light emitting diode 110 may be, for example, an LED (Light Emitting Diode) including one end having an anode terminal formed thereto and another end having a cathode terminal formed thereto. The light emitting diode 110 is not limited to an LED. For example, a surface emitting laser may be used as the light emitting device. For example, the encapsulating resin 120 may be an insulating resin (e.g., epoxy type resin, silicone type resin) including a fluorescent material.

In the following embodiment, the light emitting device 110 is described as an LED, and the light emitting device package 100 is described as an LED package. Thus, the light emitting device 110 may also be referred to as "LED 110", and the light emitting device package 100 may also be referred to as "LED package 100".

The dimension of the LED 110 mounted on the light emitting device mounting package 1 may be, for example, 0.3 mm (length)×0.3 mm (width), 1.0 mm (length)×1.0 mm (width), or 1.5 mm (length)×1.5 mm (width) from a plan view.

A bump 111 and a bump 112 are formed on the LED 110. The bump 111 is one of the electrode terminals of the LED 110 and the bump 112 is another one of the electrode terminals of the LED 110. One of the bumps 111, 112 is an anode terminal whereas the other one of the bumps 111 is a cathode terminal. The bumps 111, 112 may be, for example, flip-chip bonded to the plating films 41, 42. The interval between the plating films 41, 42 is determined to match the interval (e.g., 60 μm) between the bump 111 and the bump 112 of the LED 110 to be mounted on the plating films 41, 42.

In the LED package 100, the light emitting device mounting package having the LED 110 mounted thereon is further mounted on the metal substrate 125. The metal substrate 125 includes a metal plate 130 that functions as a heat radiating part (heat radiating plate), an insulating layer 140 that is formed on one surface of the metal plate 130, a wiring layer 150 that is formed on the insulating layer 140, and a solder resist layer 155 that covers a selected part(s) of the wiring layer 150.

An opening part 155x and an opening part 155y are formed in the solder resist layer 155. A part of the wiring layer 150 is exposed from each of the opening part 155x and the opening part 155y. The part of the wiring layer 150 exposed from the opening part 155x may also be hereinafter referred to as "pad 150A", and the part of the wiring layer 150 exposed from the opening part 155y may also be hereinafter referred to as "external connection pad 150B".

For example, copper (Cu) or aluminum (Al) that have satisfactory thermal conductivity may be used as the material of the metal plate 130. The thickness of the metal plate 130 may be, for example, approximately 100 μm to 500 μm. However, in a case where heat radiation is required, the metal plate 130 may have a thickness of approximately a few mm. For example, an insulating resin such as an epoxy type resin or a silicone type resin may be used as the material of the insulating layer 140. For example, copper (Cu) may be used as the material of the wiring layer 150.

One of the pads 150A is electrically connected to a part of the through-wiring 150 (connection terminal) exposed from the other surface of the substrate 10 by way of a bonding part 160 formed of solder or a conductive paste. That is, one of the pads 150A is electrically connected to the bump 111 (i.e. one of the electrode terminals of the LED 110) by way of the through-wiring 51, the wiring 31, and the plating film 41.

Similarly, the other one of the pads 150A is electrically connected to a part of the through-wiring 52 (connection terminal) by way of the bonding part 160 formed of solder or a conductive plate. That is, the other one of the pads 150A is electrically connected to the bump 112 (i.e. the other one of the electrode terminals of the LED 110) by way of the through-wiring 52, the wiring 32, and the plating film 42.

The external connection pad 150B is connected to, for example, a power source or a drive circuit provided outside of the light emitting device package 100. Thus, by generating a predetermined potential difference between the bump 111 and the bump 112 of the LED 110, light is radiated from LED 110. Further, heat is generated from the LED 110 when the LED 110 is lit.

The heat generated from the LED 110 is transmitted to the through-wiring 51 by way of the plating film 41 and the wiring 31. Further, the heat generated from the LED 110 is transmitted to the metal plate 130 by way of the one of the pads 150A and the insulating layer 140. Similarly, the heat generated from the LED 110 is transmitted to the through-wiring 52 by way of the plating film 42 and the wiring 32. Further, the heat generated from the LED 110 is transmitted to the metal plate 130 by way of the other one of the pads 150A and the insulating layer 140. Then, the heat transmitted to the metal plate 130 is radiated from the metal plate 130.

Accordingly, the through-wirings 51, 52 constitute an electric connection path between the LED 110 mounted on the light emitting device mounting part and the metal substrate 125 mainly contributing to heat radiation. In addition, the through-wirings 51, 52 constitute a heat radiation path for transmitting the heat generated from the LED 110 to the metal plate 130 of the metal substrate 125.

Because the through-wirings 51, 52 are positioned in the vicinity of the LED 110 (e.g., directly below the LED 110), the heat generated from the LED 110 can be efficiently transmitted to the metal plate 130 and radiated from the metal plate 130.

<Method for Manufacturing Light Emitting Device Mounting Package of First Embodiment>

Next, a method for manufacturing a light emitting device mounting package according to a first embodiment of the present invention is described. FIGS. 5A-7C are schematic diagrams illustrating steps for manufacturing the light emitting device mounting package of the first embodiment. The following cross-sectional views used for describing the steps for manufacturing the light emitting device mounting package of the first embodiment (FIGS. 5B-7C) correspond to the cross-sectional view of FIG. 2B.

Figure 5A:
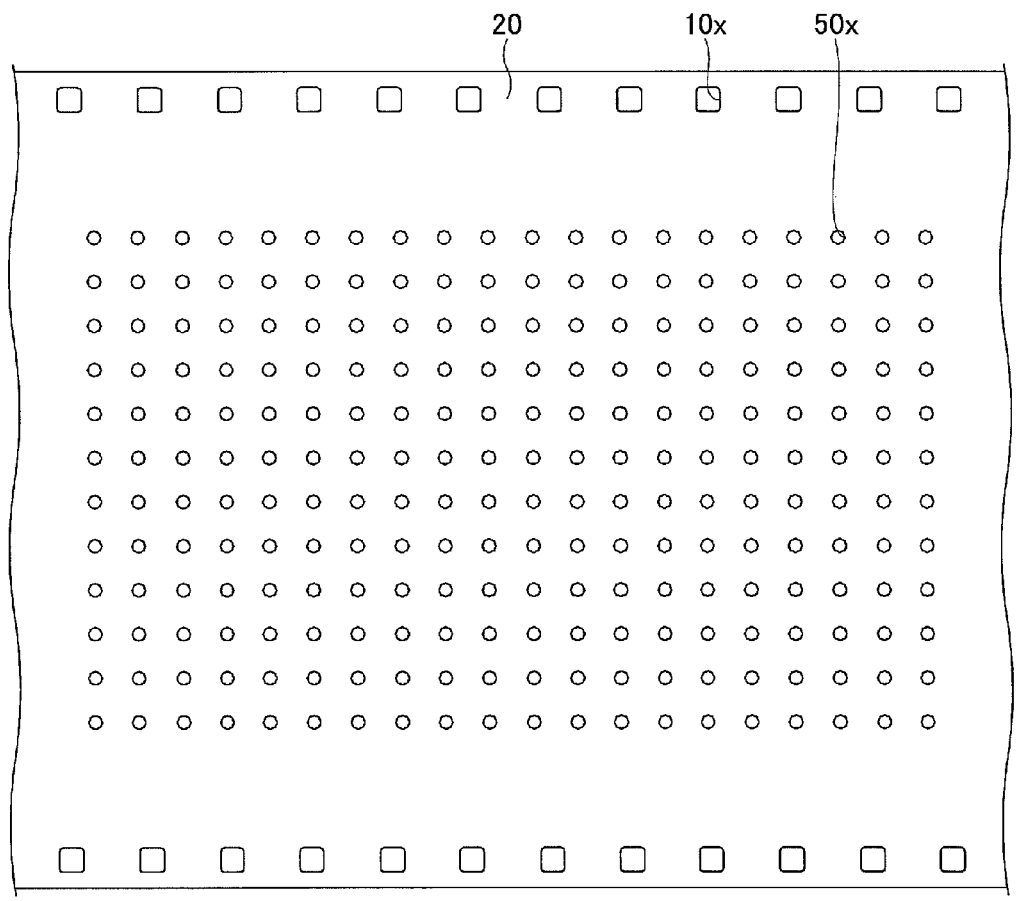
FIGS. 5A-5B are schematic diagrams illustrating steps for manufacturing a light emitting device mounting package of the first embodiment (part 1)
Figure 5B:
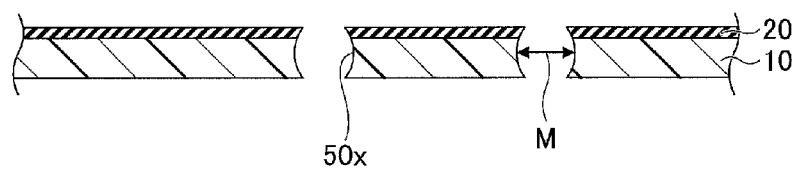

First, in the process illustrated in FIG. 5A and FIG. 5B (FIG. 5A being a plan view, FIG. 5B being a cross-sectional view), the substrate 10 is prepared. The substrate 10 may be, for example, a polyimide film that is provided in the form of a tape or a reel of tape. The adhesive layer 20 may be formed on the substrate 10 by applying, for example, an epoxy type adhesive agent on one surface of the substrate 10. Alternatively, the adhesive layer 20 may be formed by laminating an epoxy type adhesive film instead of applying the epoxy type adhesive agent.

Then, the sprocket holes 10x and through-holes 50x, that penetrate the substrate 10 and the adhesive layer 20, are formed in the substrate 10 having the adhesive layer 20 formed on its one surface. The sprocket holes 10x are formed on both ends in the traverse direction of the substrate 10 (i.e. longitudinal direction in FIG. 5A) and consecutively arranged at substantially equal intervals along the longitudinal direction of the substrate 10 (i.e. horizontal direction in FIG. 5A). The through-holes 50x are formed in predetermined areas corresponding to the areas in which the wirings 30 are to be formed in the below-described process (i.e. areas corresponding to the through-wirings 50 illustrated in FIG. 1).

The sprocket holes 10x and the through-holes 50x may be formed by, for example, a press-working method using a mold including a die and a punch. In this case, a part of the through-hole 50x inside the substrate 10 may be formed into the shape of the maximum part M by adjusting the clearance between the punch and the die of the mold. That is, the maximum part M having a plan-view shape larger than a plan-view shape of one end of the through-hole 50x can be formed by adjusting the clearance between the punch and the die of the mold. For example, a part of the through-hole 50x in a thickness direction of the substrate 10 (e.g., center part of the through-wiring 50 in the thickness direction of the substrate 10) may be expanded in a horizontal direction, so that side surfaces of the through-hole 50x have circular arc shapes from a cross-sectional view.

Figure 6A:
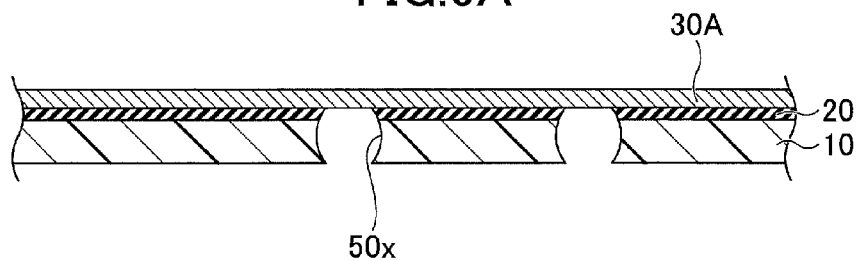
FIGS. 6A-6D are schematic diagrams illustrating steps for manufacturing a light emitting device mounting package of the first embodiment (part 2)

Then, in the process illustrated in FIG. 6A, the metal layer 30A is formed on the adhesive layer 20. Then, the adhesive layer 20 is cured by heating the adhesive layer 20 to a predetermined temperature. The metal layer 30A may be formed by, for example, laminating a copper foil on the adhesive layer 20. The thickness of the metal layer 30A may be, for example, approximately 18 μm to 35 μm. It is to be noted that the metal layer 30A is formed into the wiring 30 by performing the below-described patterning process on the metal layer 30A.

Figure 6B:
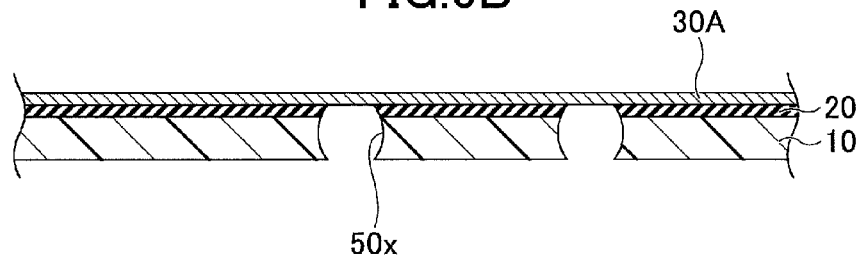

Then, in the process illustrated in FIG. 6B, the structural body illustrated in FIG. 6A is impregnated in a solution used for wet-etching (e.g., hydrogen peroxide type solution) to etch upper and lower surfaces of the metal layer 30A exposed in the through-hole 50x (so-called micro-etching process). By performing the etching process, an antirust agent can be removed from the surface of the metal layer 30A, and the thickness of the surface of the metal layer 30A can be slightly reduced (e.g., approximately 0.5 μm to 1 μm). However, the etching process is not a requisite. That is, the etching process may be performed according to necessity.

Figure 6C:
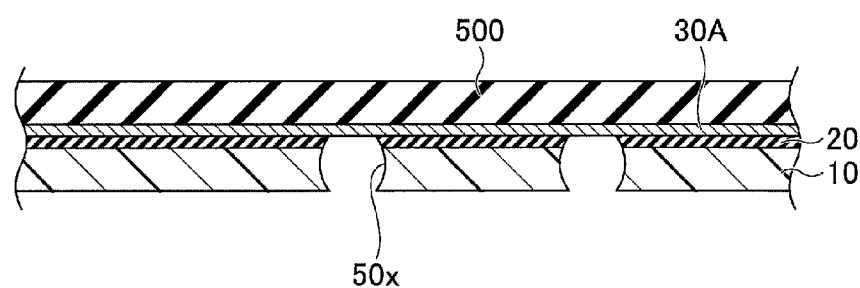

Then, in the process illustrated in FIG. 6C, a masking tape 500 is adhered to the upper surface of the metal layer 30A. The masking tape 500 is used to cover the upper surface of the metal layer 30A for preventing a plating film from growing on the upper surface side of the metal layer 30A when forming the through-wiring 50 with the below-described electroplating method of FIG. 6D.

Figure 6D:
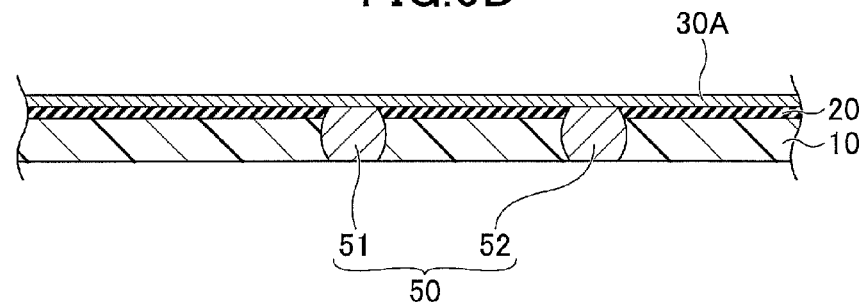

Then, in the process illustrated in FIG. 6D, the through-wiring 50 (through-wirings 51 and 52) is formed by the electroplating method using the metal layer 30A as a power-feeding layer. Then, the masking tape 500 illustrated in FIG. 6C is removed. The through-wiring 50 is formed into a columnar shape by depositing a metal plating on the lower surface of the metal layer 30A exposed in the through-hole 50x and filling the inside of the through-hole 50x with the metal plating.

The through-wiring 50 is formed, so that one end (upper end in FIG. 6D) of the through-wiring 50 is electrically connected to the metal layer 30A whereas another end (lower end in FIG. 6D) of the through-wiring 50 is exposed from the other surface of the substrate 10 to form an exposed part. The other end of the through-wiring 50 may be substantially flush with the other surface of each substrate 10. For example, copper (Cu) may be used as the material of the through-wiring 50.

Figure 7A:
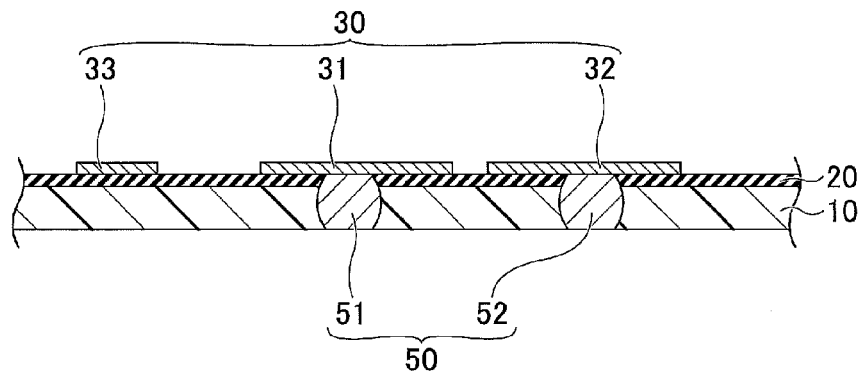
FIGS. 7A-7C are schematic diagrams illustrating steps for manufacturing a light emitting device mounting package of the first embodiment (part 3)

Then, in the process illustrated in FIG. 7A, the wiring 30, which includes the wirings 31, 32 (light emitting device mounting part) and the bus line 33, is formed by patterning the metal layer 30A. More specifically, resist (not illustrated) is applied on the metal layer 30A and exposed to a light corresponding to the pattern of the wiring. Thereby, a pattern of the wiring 30 is developed on the resist. Then, by etching the metal layer 30A by using the resist as a mask, the wiring 30 having a predetermined pattern is formed (patterning). Then, the resist is removed.

Figure 7B:
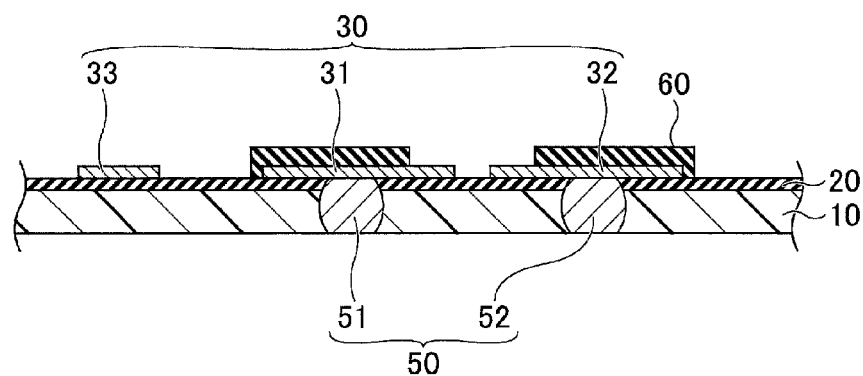

Then, in the process illustrated in FIG. 7B, the insulating layer 60 is formed on a predetermined part of the wiring 31 and a predetermined part of the wiring 32. The predetermined parts of the wirings 31, 32 are parts of the wirings 31, 32 in which the plating films 41, 42 are not formed in a subsequent process. A white color type material may be used to form the insulating layer 60. The insulating layer 60 may be formed by using, for example, a screen printing method. In forming the insulating layer 60, a blasting process or a laser process may be performed on the insulating layer 60 after a white ink or the like is formed to cover the entire wiring 30. Thereby, the parts of the wirings 31, 32 on which the plating films 41 42 are to be formed become exposed from the insulating layer 60.

Figure 7C:
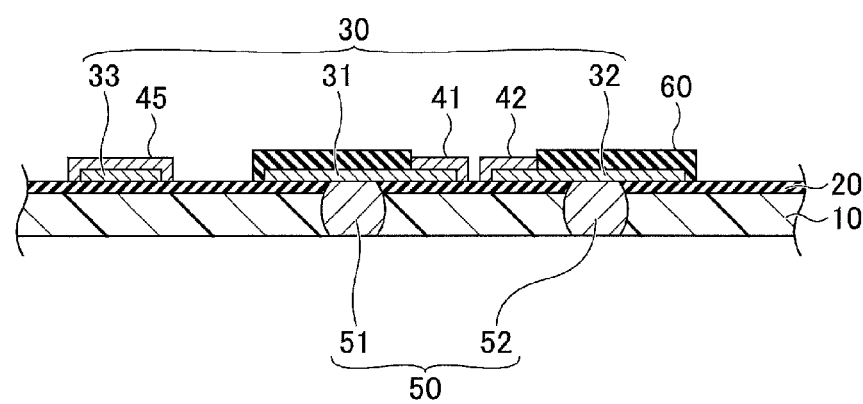

Then, in the process illustrated in FIG. 7C, an electroplating process is performed by using the bus line 33 as the power-feeding layer. Thereby, the plating films 41, 42, 43, and 44 are formed on the surfaces of the wirings 31, 32 that are exposed from the insulating layer 60. It is to be noted that the plating film 45 is formed on the bus line 33. The materials and thicknesses of the plating films 41, 42, 43, 44, and 45 are the same as those described above.

Then, after performing the process illustrated in FIG. 7C, the manufacturing of the light emitting device mounting package 1 illustrated in FIGS. 1-2B is completed by cutting the structural body of FIG. 7C into individual pieces. The structure body of FIG. 7C is cut into individual pieces by cutting a predetermined part(s) of the substrate 10 in a direction orthogonal to the longitudinal direction of the substrate 10.

It is to be noted that the light emitting device package 100 illustrated in FIG. 4 can be manufactured as described below. For example, the light emitting device mounting package 1 is mounted on a mounting device. Then, a solder cream is applied on the plating films 41, 42 of each individual package area C. Then, the bumps 111, 112 of each light emitting device 110 are placed on the solder cream of the plating films 41, 42 of each individual package area C. Then, the solder cream is cured after being melted by a reflow furnace.

Then, the upper surface of the light emitting device mounting package 1 is encapsulated by the encapsulating resin 120. Then, the light emitting device mounting package 1 is cut into individual pieces by cutting the border areas between the individual package areas C of the light emitting device mounting package 1. Alternatively, the light emitting device mounting package 1 may be cut into individual pieces by cutting the individual package areas C beforehand, so that each piece of the light emitting device mounting package 1 corresponding to the individual package area C can be encapsulated by the encapsulating resin 120. Then, each piece of the light emitting device mounting package 1 is mounted on the metal substrate 125 that includes the metal plate 130, the insulating layer 140, and the wiring layer 150. More specifically, each exposed part of the through-wirings 51, 52 (connection terminal) is electrically connected to the pad 150A by way of the bonding part 160. Thereby, the manufacturing of the light emitting device package 100 illustrated in FIG. 4 is completed.

Hence, with the above-described light emitting device mounting package 1, the so-called "unsheathing" of the wiring 30 and the through-wiring 50 can be prevented by forming the maximum part M in a part of the through-wiring 50 buried in the substrate 10. That is, the unsheathing can be prevented owing to the maximum part M having a plan-view shape larger than a plan-view shape of the one end of the through-wiring 50.

Further, in addition to using the through-wirings 51, 52 as paths for electric connection, the through-wirings 51, 52 are also used as heat radiation paths for radiating the heat generated from the light emitting device 110. Thereby, the heat generated from the light emitting device 110 can be transmitted to the heat radiating part (metal plate 130) and radiated from the heat radiating part (metal plate 130). Because the through-wirings 51, 52 are positioned directly below the light emitting device mounting part (wirings 31, 32) on which the light emitting device 11 is mounted, the heat generated from the light emitting device 11 can be efficiently transmitted to the heat radiating part (metal plate 130) and radiated from the heat radiating part (metal plate 130).

Further, because heat radiation is improved by positioning the through-wirings 51, 52 immediately below the light emitting device mounting part, the thickness of the wiring 30 need not be increased more than necessary for improving heat radiation compared to the conventional light emitting device mounting package. Therefore, a relatively thin copper foil having a thickness of approximately 12 g m to 35 µm can be used as the wiring 30. Further, the interval between the wiring 31 and the wiring 32 can be narrow (e.g., 60 µm).

Further, in the conventional light emitting package, the mismatch between the thermal expansion coefficient of the light emitting device and the thermal expansion coefficient of the heat radiation plate leads to the risk of degrading the connection reliability between the light emitting device and the light emitting device mounting part. However, with the light emitting device package 100, the substrate 10 that is mainly formed of a flexible resin material is provided between the light emitting diode 110 and the metal plate 130 functioning as the heat radiation plate. Therefore, the mismatch between the thermal expansion coefficient of the light emitting device 110 and the thermal expansion coefficient of the metal plate 130 is relieved. Accordingly, the connection reliability between the light emitting device 110 and the light emitting device mounting part can be improved.

Second Embodiment

In the following second embodiment of the present invention, a structure of a light emitting device mounting package that is different from the structure of the light emitting device mounting package 1 of the first embodiment is described. In the second embodiment, like components/parts are denoted with like reference numerals as the reference numerals of the first embodiment and are not further explained.

Figure 8:
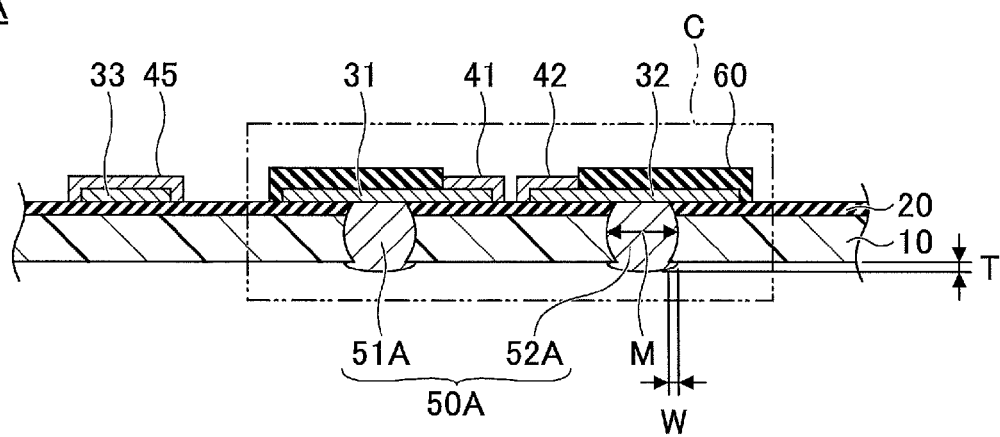
FIG. 8 is a cross-sectional view illustrating a light emitting device mounting package according to a second embodiment of the present invention.

FIG. 8 is a cross-sectional view illustrating a light emitting device mounting package 1A according to the second embodiment of the present invention. FIG. 8 is a cross-sectional view corresponding to the cross-sectional view of FIG. 2B. Because the plan view of the light emitting device mounting package 1A is substantially the same as the plan view of the light emitting device mounting package 1, the plan view of the light emitting device mounting package 1A is omitted.

With reference to FIG. 8, the light emitting device mounting package 1A is different from the light emitting device mounting package 1 (see FIGS. 2A and 2B) in that the through-wiring 50 (including through-wirings 51 and 52) is replace with a through-wiring 50A (including through-wirings 51A and 52A).

A projecting part is formed on the other end of the through-wiring 50A. The projecting part projects from the other surface of the substrate 10 and extends to the periphery of the end of the through-wiring 50A on the other surface side of the substrate 10. For example, the projecting part of the through-wiring 50A may extend to form a ring-like shape (e.g., circular ring shape, quadrangular ring shape) at the periphery of the end of the through-wiring 50A on the other surface side of the substrate 10. That is, the plan-view shape of the projecting part of the through-wiring 50A is larger than the plan-view shape of the other end of the through-wiring 50A. An amount in which the projecting part of the through-wiring 50A projects from the other surface of the substrate 10 (projection amount T) may be, for example, approximately 20 µm to 50 µm. A length in which the projecting part of the through-wiring 50A extends to the periphery of the end of the through-wiring 50A on the other surface side of the substrate 10 (width W) may be, for example, approximately 2 µm to 10 µm.

Similar to the process illustrated in FIG. 6D, an electroplating method using the metal layer 30A as the power-feeding layer may be performed for forming the projecting part. By continuing the electroplating method, a metal material fills the inside of the through-hole 50x and projects from the other surface of the substrate 10.

In this case, by adjusting the time for performing the plating process, the other end of the through-wiring 50A can be formed to project from the other surface of the substrate 10 and extend to the periphery of the end of the through-wiring 50A on the other surface side of the substrate 10.

Thus, compared to a case where only the maximum part M is formed in the through-wiring 50, the unsheathing of the wiring 30 and the through-wiring 50 can be further prevented by providing the projecting part that projects from the other surface of the substrate and extends to the periphery of the end of the substrate 10.

Third Embodiment

Figure 9:
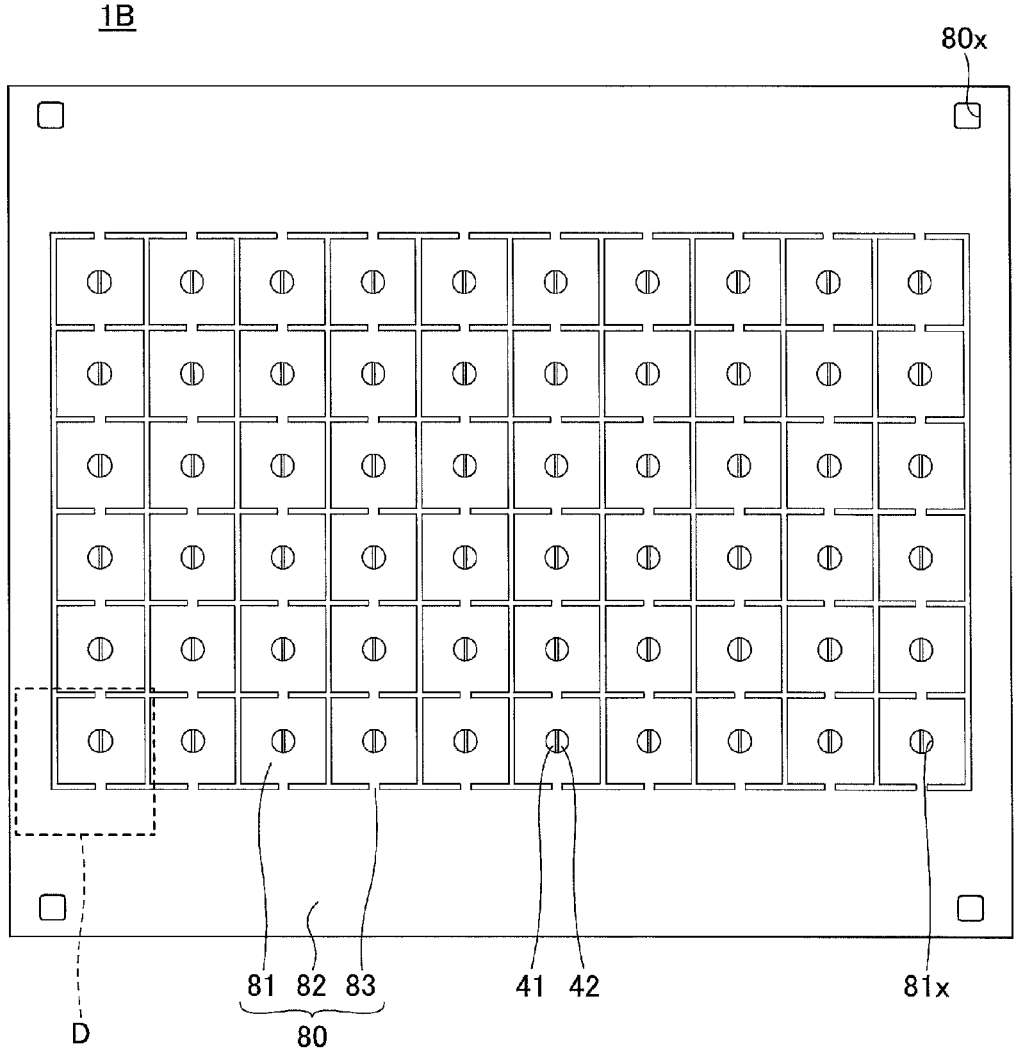
FIG. 9 is a plan view illustrating a light emitting device mounting package of according to a third embodiment of the present invention.
Figure 10A:
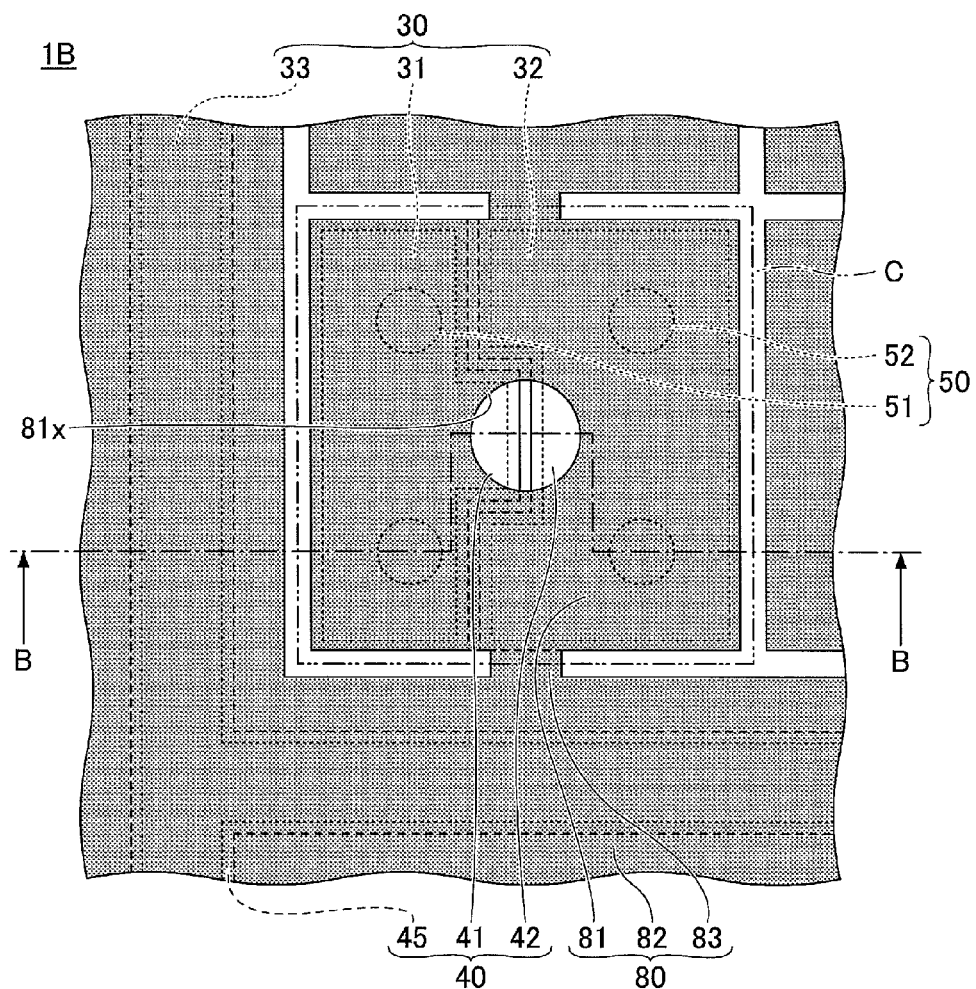
FIGS. 10A and 10B are enlarged views illustrating a part D of FIG. 9.
Figure 10B:
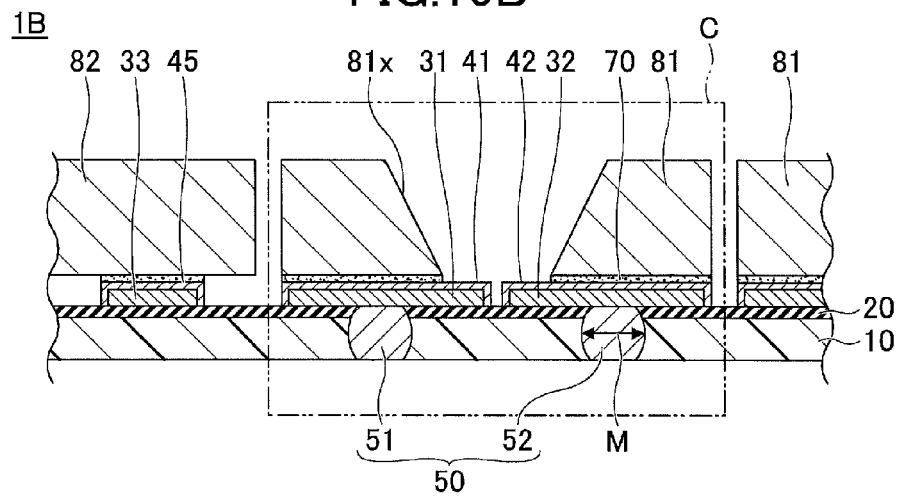

In the following third embodiment of the present invention, a structure of a light emitting device mounting package is described. In the third embodiment, like components/parts are denoted with like reference numerals as the reference numerals of the first embodiment and are not further explained. FIG. 9 is a plan view illustrating a light emitting device mounting package of the third embodiment. FIGS. 10A and 10B are enlarged views illustrating part D of FIG. 9 (i.e. the part surrounded by a dashed line in FIG. 9). FIG. 10A is a plan view of the part D. FIG. 10B is a cross-sectional view taken along line B-B of FIG. 10A. For the sake of convenience, a metal member 80 is illustrated with a matte pattern in FIG. 10A.

With reference to FIGS. 9, 10A, and 10B, the light emitting device mounting package 1B is mainly different from the light emitting device mounting package 1 (see FIGS. 1-2B) in that the metal member 80 is provided on the surface of the light emitting device mounting package 13 instead of the insulating layer 60.

In the light emitting device mounting package 1B, the plating film 41 is formed to cover the upper and side surfaces of the wiring 31. Further, the plating film 42 is formed to cover the upper and side surface of the wiring 32. Similar to the first embodiment, the plating film 45 is formed to cover the upper and side surfaces of the bus line 33. It is to be noted that the plating films 43, 44 are not formed in this embodiment. Instead, the plating films 41, 42 are formed on areas corresponding to the areas on which the plating films 43, 44 are formed in the first embodiment.

The metal member 80 is adhered to the plating film 40 (plating films 41, 42, and 45) by way of an adhesive layer 70. For example, an adhesive agent formed of an insulating resin such as an epoxy type resin, a silicone type resin, or a polyimide type resin may be used as the material of the adhesive layer 70. An insulating adhesive agent having a heat resistant property may be used as the adhesive layer 70 according to necessity. The thickness of the adhesive layer 70 may be, for example, approximately 8 μm to 18 μm. It is to be noted that the adhesive agent used for the adhesive layer 70 may be the same or different as the adhesive agent used for the adhesive layer 20.

In the light emitting device mounting package 1B, multiple individual package areas C, which are to be cut into individual pieces, are arranged on the substrate 10 in both vertical and horizontal directions of the light emitting device mounting package 1B. The metal member 80 includes multiple reflection plates 81, a frame part 82, and a hanging part 83. The multiple reflection plates 81 are arranged at predetermined intervals in vertical and horizontal directions of the light emitting device mounting package 1B. The frame part 82 is provided to surround the multiple reflection plates 81 arranged at predetermined intervals in vertical and horizontal directions of the light emitting device mounting package 1B. The hanging part 83 is provided to couple the frame part 82 and the reflection plate 81 adjacent to the frame part 82 and couple the reflection plates 81 adjacent to each other. One reflection plate 81 is provided on the light emitting device mounting part of each individual package area C. The reflection plate 81, the frame part 82, and the hanging part 83 are integrally formed.

It is to be noted that, although the hanging parts 83 of this embodiment are provided only in a single direction (in this embodiment, vertical direction in FIG. 9), the hanging parts 83 may be provided in a horizontal direction, or both vertical and horizontal directions in FIG. 9. Sprocket holes 80x having the same functions as the sprocket holes 10x are provided in the frame part 82 of the metal member 80.

An opening part 81x that exposes a part of the plating film 41 and a part of the plating film 42 is formed in each reflection plate 81 of the metal member 80. The plating films 41, 42 exposed in the opening part 81x are connection parts that are to be connected to the one or the other of the electrodes of the light emitting device 110. An inner wall surface of the opening part 81 is inclined, so that the opening part 81 is formed as a trumpet-like shape that becomes wider toward its upper side. The inner wall surface of the opening part 81x has a function of reflecting the light radiated from the light emitting device 110 in a predetermined direction in a case where the light is radiated from the light emitting device 110 mounted on the plating films 41, 42 exposed in the opening part 81x.

The angle of the inclination of the inner wall surface of the opening part 81x with respect to the upper surface of the plating film 40 may be arbitrarily set according to a desired specification. For example, the angle of the inclination of the inner wall surface of the opening part 81x may be approximately 20 to 50 degrees. However, the cross-section of the inner wall surface of the opening part 81x is not limited to a straight linear shape but may also be a curved shaped. The opening part 81x is preferred to have a small plan-view shape from the standpoint of improving reflectivity. For example, the plan-view shape of the opening part 81x may be a circular shape having a diameter of approximately a few mm. However, the plan-view shape of the opening part 81x is not limited to the circular shape but may also be an elliptical shape or a rectangular shape.

The thickness of the metal member 80 may be, for example, approximately 0.5 mm. For example, copper, aluminum, or their alloys may be used as the material of the metal member 80. In using the aforementioned material as the metal member 80, the metal member 80 is preferred to have its glossiness increased by polishing (e.g., chemical polishing) the surface of the metal member 80. This is because the reflectivity at the inner wall surface of the opening part 81x of the reflection plate 81 can be increased in a case where the light emitting device 110 is mounted and illuminated.

Further, the glossiness of the metal member 80 may also be increased by performing a plating process (e.g., gold plating, silver plating) on the surface of the metal member 80. In this case, it is preferable to select a plating material having high reflectivity with respect to the wavelength of the light radiated from the light emitting device 110. The polishing process and the plating process may be performed on the entire metal member 80 or a particular part of the metal member 80 (e.g., only the part of the inner wall surface of the opening part 81x).

It is to be noted that another opening part besides the opening part 81x may also be provided in each reflection plate 81. For example, the other opening part may be provided in the area on which the plating films 43, 44 are formed in the first embodiment. Thereby, a protection component such as a Zener diode may be mounted on the plating films 41, 42 exposed in the other opening part.

Figure 11:
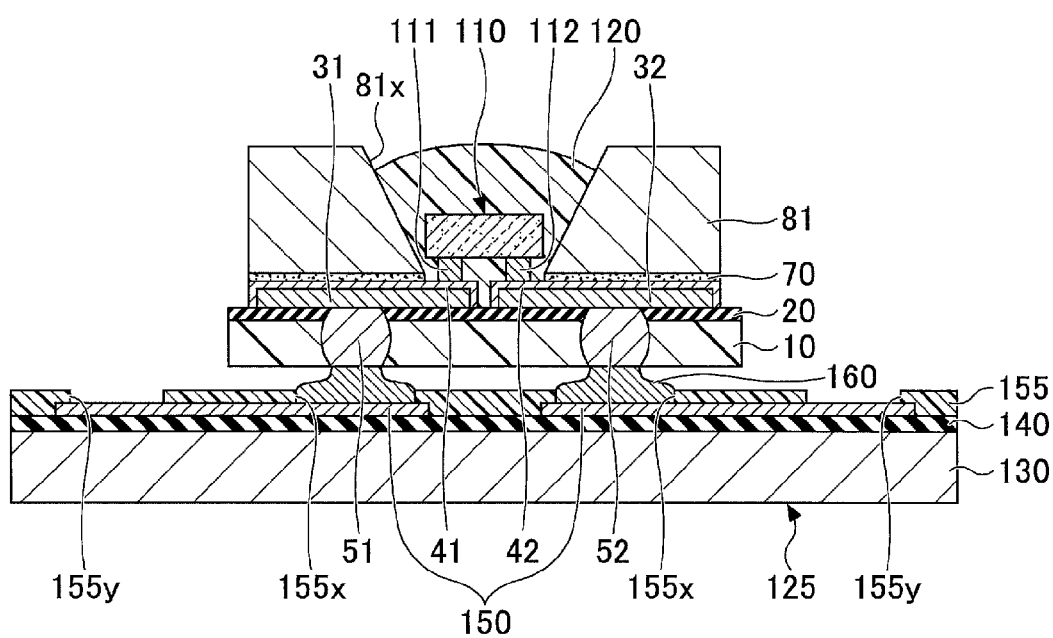
FIG. 11 is a cross-sectional view illustrating a light emitting package according to a third embodiment of the present invention.

FIG. 11 is a cross-sectional view illustrating a light emitting package 100B according to the third embodiment of the present invention. With reference to FIG. 11, the light emitting device package 100B is obtained by cutting the light emitting diode mounting package 1B into respective individual package areas C, mounting the light emitting device 110 on the light emitting device mounting part (wiring 31 and wiring 32) in the individual package area C, encapsulating the light emitting device 110 with the encapsulating resin 120, and further mounting the light emitting device 110 (being mounted on the light emitting device mounting package 1B) on the metal substrate 125. The encapsulating resin 120 is provided in the opening part 81x of the reflection plate 81.

In this embodiment, owing to the inclination of the inner wall surface of the opening part 81x of the reflection plate 81, the light radiated from the light emitting device 110 can be efficiently reflected in a predetermined direction when the light is radiated from the light emitting device 110 (improvement of reflectivity).

<Method for Manufacturing Light Emitting Device Mounting Package of Third Embodiment>

Figure 12A:
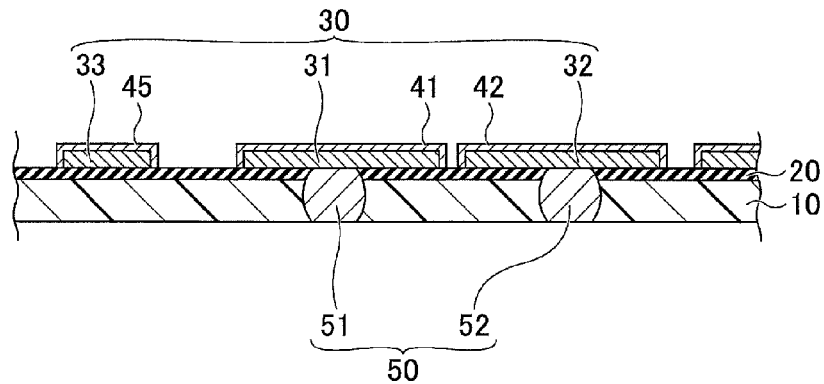
FIGS. 12A-12C are schematic diagrams illustrating steps for manufacturing a light emitting device mounting package of the third embodiment.
Figure 12B:
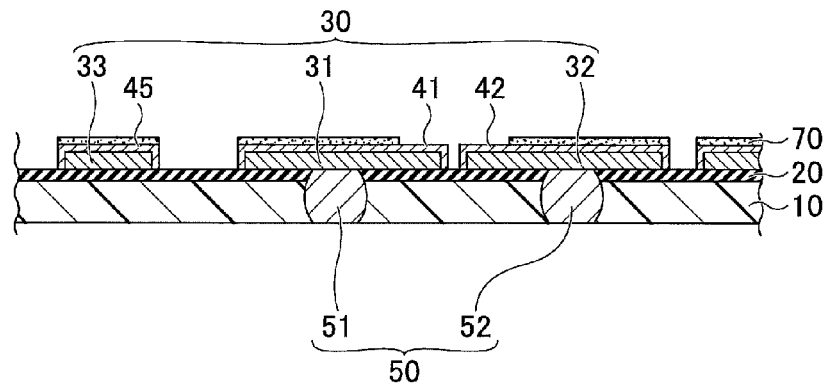
Figure 12C:
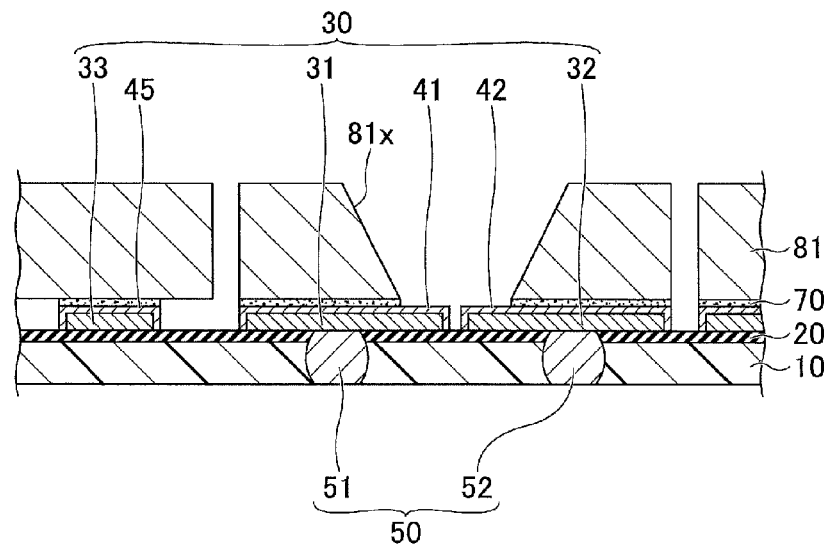

Next, a method for manufacturing a light emitting device mounting package according to the third embodiment of the present invention is described. FIGS. 12A-12C are schematic diagrams illustrating steps for manufacturing the light emitting device mounting package of the third embodiment. The following cross-sectional views used for describing the steps for manufacturing the light emitting device mounting package of the third embodiment (FIGS. 12A-12C) correspond to the cross-sectional view of FIG. 10B.

First, the processes illustrated in FIGS. 5A-7A of the first embodiment are performed. Then, similar to the process illustrated in FIG. 7C, the plating films 41, 42, and 45 are formed in the process illustrated in FIG. 12A. However, because the insulating layer 60 is not formed in this embodiment, the plating film 41 is formed to cover the upper and side surfaces of the wiring 31. Further, the plating film 42 is formed to cover the upper and side surfaces of the wiring 32.

Then, in the process illustrated in FIG. 12B, the adhesive layer 70 is formed by applying, for example, an epoxy type adhesive agent on predetermined areas on the plating films

41, 42, and 45. Alternatively, the adhesive layer 70 may be formed by laminating an epoxy type adhesive film instead of applying the epoxy type adhesive agent. It is to be noted that the predetermined areas are areas excluding the parts that are exposed in the opening part 81x of each reflection plate 81.

Then, in the process illustrated in FIG. 12C, the metal member 80 that is prepared beforehand is adhered on the plating films 41, 42, and 45 by way of the adhesive layer 70. The opening part 81x and the hanging part 83 are already formed in predetermined parts of the prepared metal member 80. The metal member 80 including the opening part 81x and the hanging part 83 may be formed by, for example, press-working or etching a metal plate. In this process, the reflection plates 81 of the metal member 80 are positioned within corresponding individual package areas C and arranged in vertical and horizontal directions of the substrate 10. Further, the plating films 41, 42 that correspond to the parts for mounting the light emitting device 110 are exposed in the opening part 81x of each reflection plate 81.

Then, after performing the process illustrated in FIG. 12C, the manufacturing of the light emitting device mounting package 1B illustrated in FIGS. 9-10B is completed by cutting a predetermined part(s) of the structural body of FIG. 12C into individual pieces. It is to be noted that the hanging part 83 is also cut when the structural body of FIG. 12C is cut into individual pieces.

Hence, by adhering the metal member 80 including the reflection plate 81 on the surface of the light emitting device mounting package 1B, the rigidity of the light emitting device mounting package 1B can be increased. Thus, warping of the light emitting device mounting package 1B can be prevented, and handling of the light emitting device mounting package 1B can be facilitated during manufacturing or after shipping.

In a case of forming the insulating layer 60 with white ink or the like as described in the first embodiment, the insulating layer 60 is desired to have a substantial thickness (approximately 40 μm to 50 μm) for improving reflectivity. However, such thickness can only be obtained by performing a printing process a multiple number of times and cannot be obtained by merely performing the printing process a single time. On the other hand, with this embodiment, owing to the inclined inner wall surface of the opening part 81x of the reflection plate 81, light can be efficiently reflected at the inclined inner wall surface. Therefore, the process of printing the white ink or the like can be omitted. Thus, the process for manufacturing the light emitting device mounting package 1B can be simplified.

Further, in the first embodiment, a ring-shaped dam may be required to be formed on the insulating layer 60 in each individual package area C of the light emitting device mounting package 1 for preventing the encapsulating resin 120 from flowing out during the process of encapsulating the light emitting device 110 with the encapsulating resin 120. However, in this embodiment, the inner wall surface of the opening part 81x of the reflection plate 81 functions as a dam for preventing the encapsulating resin 120 from flowing out during the process of encapsulating the light emitting device 110 with the encapsulating resin 120. Therefore, this embodiment requires no component for functioning as a dam. Thus, the process for manufacturing the light emitting device mounting package 1B and the light emitting diode package 100B can be simplified.

Further, because the heat generated from the light emitting device 110 can also be radiated from the reflection plate 81, the heat radiating property of the light emitting device package 100B can be improved. In a case where importance is placed on the heat radiating property of the light emitting device package 1B, a metal material having high thermal conductivity (e.g., copper) is preferred to be used for the reflection plate 81. In a case where importance is placed on the weight reduction of the light emitting device package 100B, a metal material having a low specific gravity (e.g., aluminum) is preferred to be used for the reflection plate 81.

<First Modified Example of Third Embodiment>

In the first modified example of the third embodiment, a reflection film is provided on a surface of the reflection plate of the third embodiment. In the first modified example of the third embodiment, like components/parts are denoted with like reference numerals as the reference numerals of the third embodiment and are not further explained.

Figure 13:
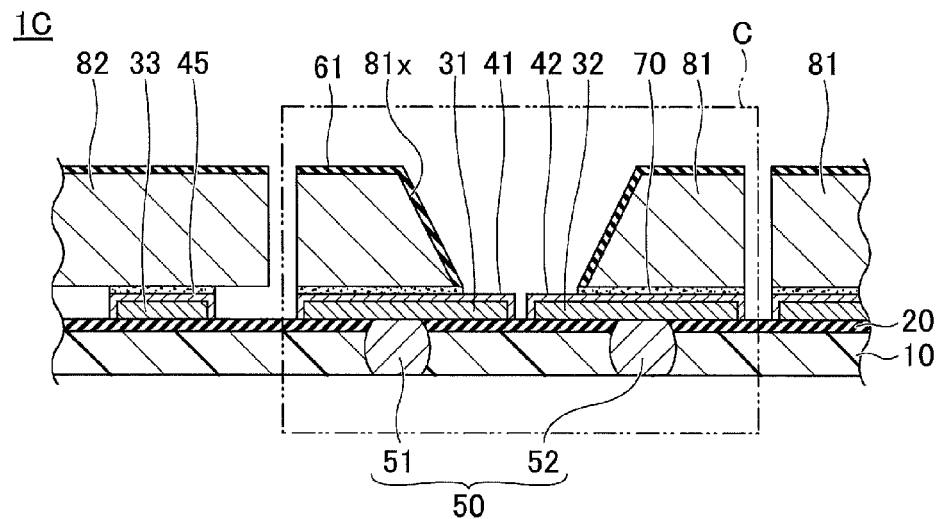
FIG. 13 is a cross-sectional view illustrating a light emitting device mounting package according to a first modified example of the third embodiment.
Figure 14:
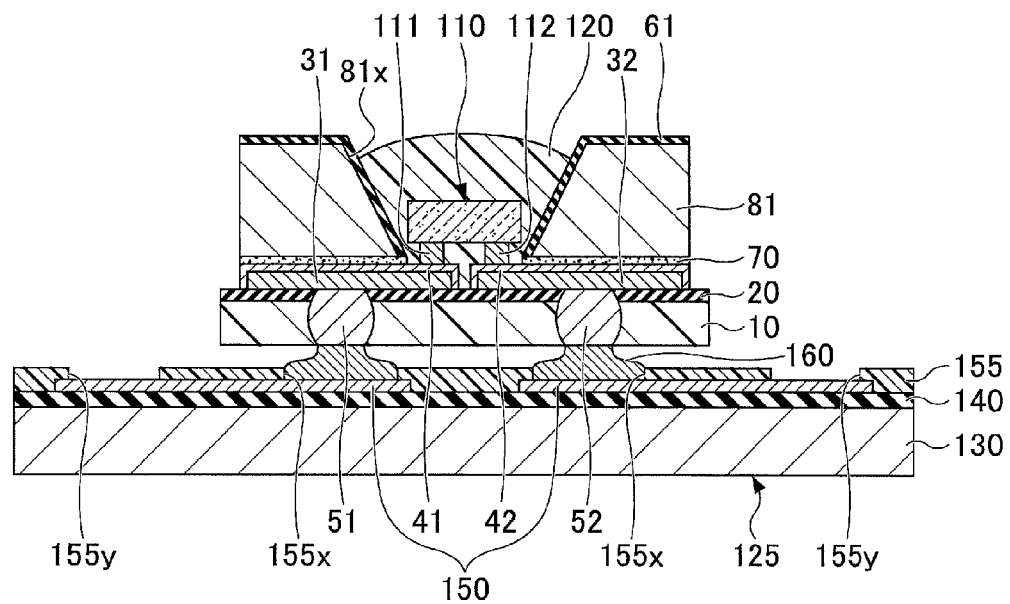
FIG. 14 is a cross-sectional view illustrating a light emitting device package according to the first modified example of the third embodiment.

FIG. 13 is a cross-sectional view illustrating a light emitting device mounting package 10 according to the first modified example of the third embodiment. FIG. 13 corresponds to the cross-sectional view of FIG. 10B. FIG. 14 is a cross-sectional view illustrating a light emitting device package 100C according to the first modified example of the third embodiment. FIG. 14 corresponds to the cross-sectional view of FIG. 11. As illustrated in the light emitting device mounting package 10 of FIG. 13 and the light emitting device 100C of FIG. 14, a reflection film 61 may be formed on the upper surface of the reflection plate 81 and the inner wall surface of the opening part 81x. Alternatively, the reflection film 61 may be only formed on the inner wall surface of the opening part 81x.

For example, the material of the reflection film 61 may be a silicone type resin (e.g., epoxy type resin, organopolysiloxane) that includes a filler or pigment of titanium oxide ($TiO_2$) or barium sulfate ($BaSO_4$). Alternatively, the material of the reflection film 61 may be a white ink that includes the above-described materials used for the reflection film 61.

For example, a screen-printing method may be used to form the reflection film 61 on the metal member 80 including the opening part 81x and the hanging part 83 formed by press-working, etching, or the like. It is to be noted that the metal member 80 may be adhered on the plating film 40 without using the adhesive layer 70 by forming the reflection film 61 on the lower surface of the metal member 80, placing the reflection film 61 on the plating film 40, and curing the reflection film 61 placed on the plating film 40. In other words, the reflection film 61 that is formed on the lower surface of the metal member 80 can also function as the adhesive layer 70.

Because the reflection film 61 is formed on the metal member 80, the reflection film 61 may be thinner compared to the insulating layer 60 of the first embodiment. The thickness of the reflection film 61 may be, for example, approximately 50 μm. Because the reflection film 61 can be formed thinner than the insulating film 60, the number of times of performing the printing process for forming the reflection film 61 can be reduced compared to the number of times of performing the printing process for forming the insulating layer 60.

Hence, by providing the reflection film 61 on the upper surface of the reflection plate 81 and the inner wall surface of the opening part 81x (or only on the inner wall surface of the opening part 81x), the reflectivity for reflecting the light radiated from the light emitting device 110 can be further increased. It is to be noted that, although the reflection film 61 need not be formed on the upper surface of the frame part 82, the reflection film 61 may be formed on the upper surface of the frame part 82 for omitting the process of masking the frame part 82.

Fourth Embodiment

In the following fourth embodiment of the present invention, a structure of a light emitting device mounting package 1D that is different from the structure of the light emitting device mounting package 1 of the first embodiment is described. In the fourth embodiment, like components/parts are denoted with like reference numerals as the reference numerals of the first embodiment and are not further explained.

Figure 15A:
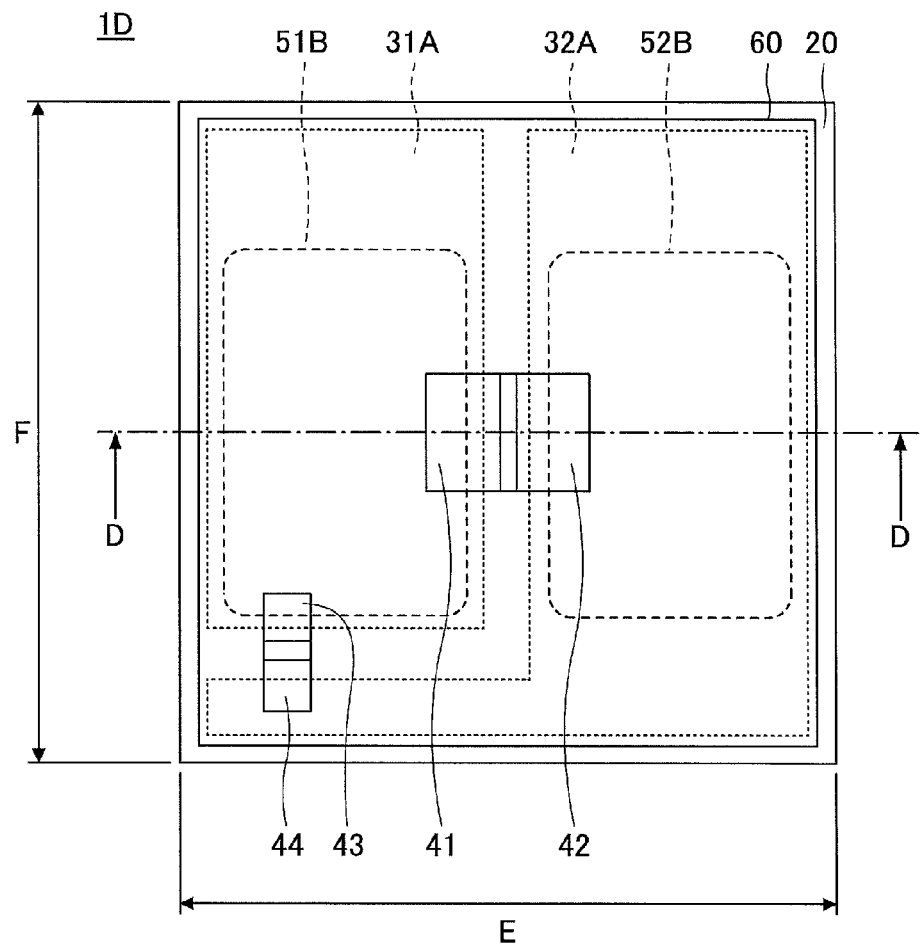
FIGS. 15A-15B are schematic diagrams illustrating a light emitting device mounting package according to a fourth embodiment of the present invention (part 1)
Figure 15B:
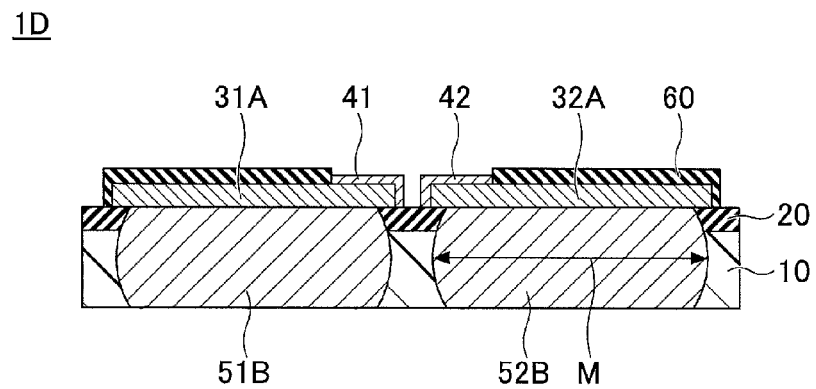
Figure 16A:
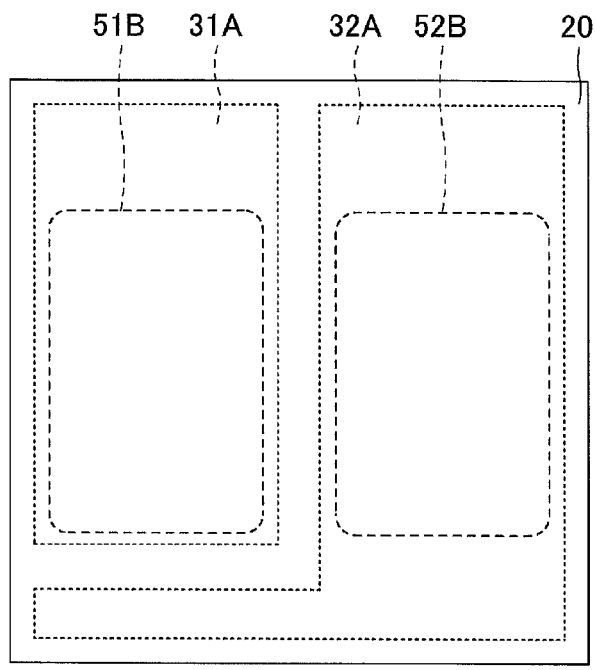
FIGS. 16A-16B are schematic diagrams illustrating alight emitting device mounting package of the fourth embodiment (part 2)
Figure 16B:
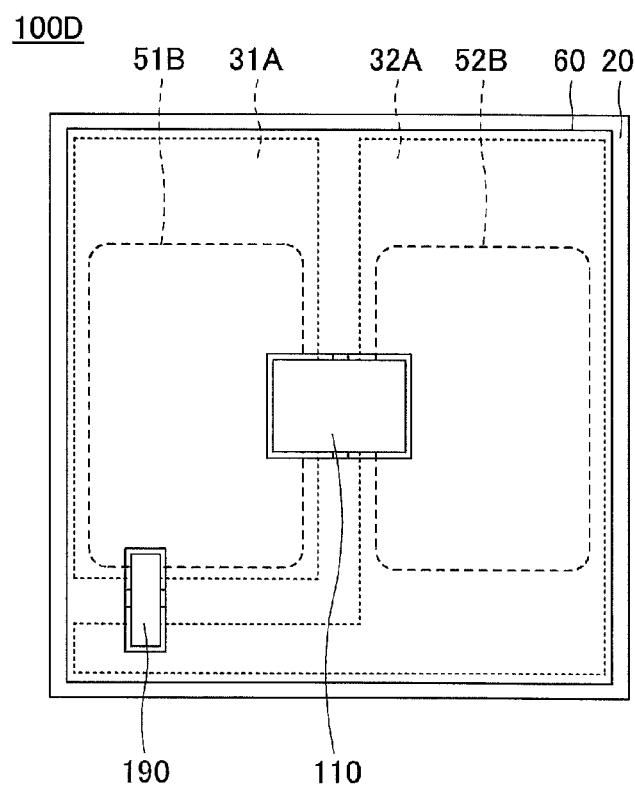

FIGS. 15A-16B are schematic diagrams illustrating the light emitting device mounting package 1D according to the fourth embodiment of the present invention. FIG. 15A is a plan view illustrating a part corresponding to the individual package area C illustrated in FIG. 2A. FIG. 15B is a cross-sectional view taken along line D-D of FIG. 15A. FIG. 16A is a plan view of a part of FIG. 15A without illustrating the plating films 41-44 and the insulating layer 60. FIG. 16B is a plan view illustrating a light emitting device package 1D in which the light emitting device 110 and a protection component 190 are mounted on the light emitting device mounting package 1D of FIG. 15A. Similar to FIGS. 1-2B, the parts that are omitted from FIGS. 1-2B (e.g., bus line 33) are also omitted from FIGS. 15A-16B.

With reference to FIGS. 15A-16B, the light emitting device mounting package 1D is different from the light emitting device mounting package 1 (see FIGS. 2A-2B) of the first embodiment in that the wirings 31, 32 are replaced with wirings 31A, 32A, and the through-wirings 51, 52 are replaced with through-wirings 51B, 52B. Further, the light emitting device mounting package 1D is different from the light emitting device mounting package 1 (see FIGS. 2A-2B) of the first embodiment in that the positions of the plating films 43, 44 that are to be connected to the electrodes of the protection component 190 are different from those of the first embodiment.

The plan-view shape of the wiring 31A is a substantially rectangular shape. The plan-view shape of the wiring 32A is a substantially L-shape. From a plan view, two sides of the wiring 31A positioned toward the wiring 32A are arranged to face two inner sides of the wiring 32A having an inverted L-shape and are separated a predetermined interval apart from the wiring 32A. Further, a combined shape of the wirings 31A and 32A constitute a substantially rectangular shape from a plan view. It is to be noted that the positions of the plating films 41, 42 formed on the wirings 31A, 32A are the same as those illustrated in FIGS. 2A-2C.

The plan-view shapes of the one ends of the through-wiring 51B, 52B (parts contacting the wirings 31A, 31B) are substantially rectangular. That is, the through-wirings 51B, 52B are obtained by forming through-holes having substantially rectangular plan-view shapes in the substrate 10 and the adhesive layer 200 and filling the through-holes with a metal plating (e.g., copper).

A maximum part M is included in parts of the through-wiring 51B, 52B buried in the substrate 10, respectively. The maximum part M has a plan-view shape larger than the plan-view shape of the one end of the through-wiring 51B and the plan-view shape of the one end of the through-wiring 52B. For example, the maximum part M may be formed by forming both side surfaces of the through-wiring 51B, 52B with a circular arc shape from a cross-sectional view. That is, a part of the through-wiring 51B, 52B in a thickness direction of the substrate 10 (e.g., center part of the through-wiring 51B, 52B in the thickness direction of the substrate 10) may be expanded in a horizontal direction, so that the side surfaces of the through-wiring 51B, 52B form a circular arc-shaped cross section. However, the cross section of the expanded part of the through-wiring 51B, 52B may have other shapes and is not limited to the shape in which both side surfaces of the through-wiring 51B, 52B have circular arc shapes.

The total area of the one end of the through-wiring 51B and the one end of the through-wiring 52B (total area of the parts of the through-wirings 51B, 52B contacting the wirings 31A, 32A) is preferably 60% or more of the entire area of the light emitting device mounting package 1D (E×F in FIG. 15A). This is because the heat radiating property can be significantly improved by increasing the areas of the one ends of the through-wirings 51B, 52B and the volumes of the through-wirings 51B, 52B.

The plating film 44 is provided on the wiring 32A in the vicinity of a corner of a short elongated part of the inverted L-shaped wiring 32A whereas the plating film 43 is provided on the wiring 31A in a position facing the plating film 44. The positions of the plating films 43, 44 are different from those of the light emitting device mounting package 1 (see FIGS. 2A-2B) of the first embodiment. However, the aspect of positioning the parts for mounting the light emitting device 110 (plating films 41, 42) as far as possible from the parts for mounting the protection component 190 is the same as the first embodiment. By positioning the parts for mounting the protection component 190 as far as possible from the parts for mounting the light emitting device 110, the protection part 190 can be prevented from blocking the light reflected from the insulating layer 60 that functions as a reflection layer for reflecting the light radiated from the light emitting device 110. Thereby, the illumination of the light emitting device 110 can be prevented from decreasing. Nevertheless, the pattern of the wirings 31A, 32A are not limited to the above-described pattern.

Because the plan-view shapes of the one ends of the through-wirings 51B, 52B are substantially rectangular, the areas of the one ends of the through-wirings 51B, 52B and the volumes of the through-wirings 51B, 52B can be increased compared to a case where the plan-view shapes of the one ends of the through-wirings 51B, 52B are substantially circular. Accordingly, the heat radiating property of the light emitting device mounting package 1D can be increased compared to that of the light emitting device mounting package 1.

Fifth Embodiment

Figure 17:
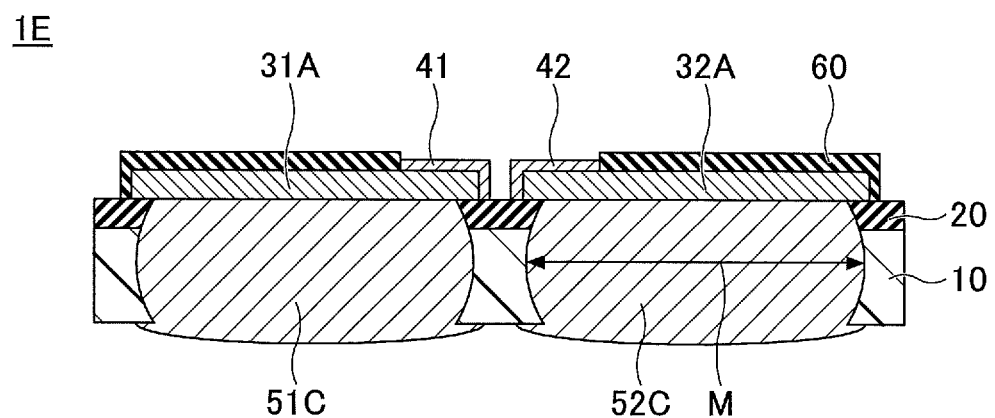
FIG. 17 is a cross-sectional view illustrating an example of a light emitting device mounting package according to a fifth embodiment of the present invention.

FIG. 17 is a cross-sectional view illustrating an example of a light emitting device mounting package 1E according to a fifth embodiment of the present invention. FIG. 17 corresponds to the cross-sectional view of FIG. 15B. Because the plan view of the light emitting device mounting package 1E of the fifth embodiment is the same as the light emitting device mounting package 1D illustrated in FIG. 15A, the plan view of the light emitting device mounting package 1E of the fifth embodiment is omitted.

With reference to FIG. 17, the light emitting device mounting package 1E is different from the light emitting device mounting package 1D (see FIG. 15A-15B) in that the through-wirings 51B, 52B are replaced with through-wirings 51C, 52C. Similar to the through-wirings 51A, 52A illustrated in FIG. 8, projecting parts are formed on the other ends of the through-wirings 51C, 52C. The projecting parts of the through-wirings 51C, 52C can be formed by performing the same process for forming the projecting parts of the through-wirings 51A, 52A.

Accordingly, the other ends of the through-wirings 51C, 52C are formed with the projecting parts that project from the other surface of the substrate and extend to the periphery of the ends of the through-holes 50 on the other surface side of the substrate 10. Thus, compared to a case where only the maximum part M is formed in the through-wirings 51C, 52C, the unsheathing of the wirings 31A, 32A and the through-wirings 510, 52C can be further prevented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, a plating film including, for example, nickel (Ni) or gold (Au) may be formed on the exposed parts of the through-wirings 51, 52, the projecting parts of the through-wirings 51A, 52A, the exposed parts of the through-wirings 51B, 52B, or the projecting parts of the through-wirings 51C, 52C.

Further, an anti-oxidation process such as an OSP (Organic Solderability Preservative) process may be performed on the exposed parts of the through-wirings 51, 52 or the projecting parts of the through-wirings 51A, 52A. Similarly, an anti-oxidation process such as an OSP (Organic Solderability Preservative) process may be performed on the exposed parts of the through-wirings 51B, 52B or the projecting parts of the through-wirings 510, 52C.

Further, alight emitting device package may be formed by mounting a light emitting device on each light emitting device mounting package by using a wire-bonding method.

The above-described embodiments and modified examples may be arbitrarily combined. For example, similar to the light emitting device mounting package 1A, the through-wirings 51 or 52 of the light emitting device mounting packages 1B or 10 may be replaced with the through-wirings 51A and 52A.

What is claimed is:

1. A package for mounting a light emitting device thereon, the package comprising:
   a substrate that is formed of resin and including through-holes penetrating the substrate;
   a light emitting device mounting part including a wiring formed on one surface of the substrate, the wiring including two areas that are arranged facing each other and being separated a predetermined interval apart from each other in a plan view;
   first and second through-wirings that are formed inside the through-holes and are provided on the two areas, respectively, each of the first and second through-wirings including one end electrically connected to the light emitting device mounting part and another end exposed from another surface of the substrate;
   wherein a part of each of the first and second through-wirings includes a maximum part having a plan-view shape that is larger than a plan-view shape of the one end of each of the first and second through-wirings,
   wherein each of the first and second through-wirings has a cross section including first and second side surfaces,
   wherein each of the first and second side surfaces has an expanding part that expands outward in a horizontal direction of the substrate.

2. The package as claimed in claim 1,
   wherein the two areas include connection parts that are to be connected to electrodes of the light emitting device.

3. The package as claimed in claim 1,
   wherein the another end of each of the first and second through-wirings includes a projecting part,
   wherein the projecting part projects from the another surface of the substrate and extends to a periphery of the another end of each of the first and second through-wirings.

4. The package as claimed in claim 3,
   wherein the projecting part has a ring-like shape.

5. The package as claimed in claim 1,
   wherein each of the maximum parts is expanded, so that a side surface of each of the first and second through-wirings is arc-shaped and forms a circular cross section.

6. The package as claimed in claim 1,
   wherein one of the two areas includes a convex part in the plan view and the other one of the two areas includes a concave part in the plan view,
   wherein the convex part is accommodated in the concave part.

7. The package as claimed in claim 1,
   further comprising:
   a reflection plate provided on the light emitting device mounting part;
   wherein the reflection plate includes an opening part that exposes a connection part to be connected to an electrode of the light emitting device.

8. The package as claimed in claim 7,
   further comprising:
   a reflection film formed on an inner wall surface of the opening part.

9. The package as claimed in claim 1,
   wherein a plurality of individual package areas are arranged on the substrate;
   wherein each of the plurality of individual package areas includes
   the light emitting device mounting part,
   the first and second through-wirings, and
   a reflection plate provided on the light emitting device mounting part,
   the reflection plate includes an opening part that exposes a connection part to be connected to an electrode of the light emitting device.

10. The package as claimed in claim 9,
    further comprising: a frame part and a plurality of hanging parts;
    wherein a plurality of reflection plates are arranged at a predetermined intervals and surrounded by the frame part,
    wherein the plurality of hanging parts connect the frame part and the plurality of reflection plates and connect the plurality of the reflection plates to each other;
    wherein the plurality of reflection plates, the plurality of hanging parts, and the frame part are integrally formed by a metal material.

11. A light emitting device package comprising:
    the package of claim 1; and
    a light emitting device mounted on the package.

12. The package as claimed in claim 1, wherein the expanding part of the first and second side surfaces forms the maximum part of the first and second through-wirings.

13. The package as claimed in claim 1, wherein each of the first and second side surfaces has the expanding part that expands outward in the horizontal direction of the substrate and forms a circular arc shape.

* * * * *